(12) United States Patent
Troian

(10) Patent No.: US 8,793,006 B2
(45) Date of Patent: Jul. 29, 2014

(54) METHOD AND APPARATUS FOR THE CONTROLLED FABRICATION OF MICRO AND NANOSCALE STRUCTURES BY THERMOCAPILLARY LITHOGRAPHY

(75) Inventor: Sandra M. Troian, Pasadena, CA (US)

(73) Assignee: California Institute of Technology, Pasadena, CA (US)

(\*) Notice: Subject to any disclaimer, the term of this patent is extended or adjusted under 35 U.S.C. 154(b) by 852 days.

(21) Appl. No.: 12/626,239

(22) Filed: Nov. 25, 2009

(65) Prior Publication Data

US 2010/0145491 A1    Jun. 10, 2010

Related U.S. Application Data

(60) Provisional application No. 61/200,219, filed on Nov. 25, 2008.

(51) Int. Cl.
*G06F 17/50* (2006.01)

(52) U.S. Cl.
USPC ............................................. 700/98; 700/118

(58) Field of Classification Search
USPC ........................................ 700/98, 118, 119
See application file for complete search history.

(56) References Cited

U.S. PATENT DOCUMENTS

| 8,241,539 B2 * | 8/2012 | Zhang et al. ............... 264/48 |
| 2004/0063250 A1 * | 4/2004 | Schaffer .................... 438/118 |
| 2011/0192233 A1 * | 8/2011 | Aizenberg et al. ............ 73/861 |

FOREIGN PATENT DOCUMENTS

| EP | 1339550 | 3/2004 |
| EP | 1251974 | 5/2005 |

OTHER PUBLICATIONS

Harkema, "Capillary Instabilities in Thin Polymer Films Mechanism of Structure Formation and Pattern Replication", Thesis of Stephen Harkema, Dec. 2005, 260 pgs.
Chou et al., "Lighographically induced self-construction of polymer microstructures for resistless patterning", Applied Physics Letters, Aug. 16, 1999, vol. 75, No. 7, pp. 1004-1006.
Chou et al., "Lithographically induced self-assembly of periodic polymer micropillar arrays", J. Vaac. Sci. Technol, Nov./Dec. 1999, vol. 17, No. 6, pp. 3197-3202.
Dietzel et al., "Formation of Nanopillar Arrays in Ultrathin Viscous Films: The Ccritical Role of Thermocapillary Stresses", Physical Review Letters, Aug. 14, 2009, vol. 103, pp. 074501-1 thru 074501-4.
Dietzel et al., "Thermocapillary Patterning of Nanoscale Polymer Films", Materials Systems and Processes for Three Dimensioinal Micro-and Nanoscale Fabrication and Lithography, 2009, vol. 1179E, 6 pgs.

(Continued)

*Primary Examiner* — Ryan Jarrett
(74) *Attorney, Agent, or Firm* — KPPB LLP

(57) ABSTRACT

An apparatus and method of controllably stimulating the growth and evolution of 2D and 3D structures from a thin film mass transfer process such that complex devices can be designed and fabricated having engineered features of different heights and separation distances in a single or few process steps are provided. More specifically, the apparatus and method allows for the construction of engineered temperature gradient fields capable of controlling for, and taking into account, proximity effects during the growth and evolution of adjacent structures, which in turn allows for the production of technologically significant micro and nanoscale devices in a number of fields.

26 Claims, 19 Drawing Sheets

(56) References Cited

OTHER PUBLICATIONS

Peng et al., "Pattern formation in a confined polymer film induced by a temperature gradient", Polymer, 2004, vol. 45, pp. 8013-8017.
Schaffer et al., "Morphological Instability of a Confined Polymer Film in a Thermal Gradient", Macromolecules, 2003, vol. 36, pp. 1645-1655.
Schaffer et al., "Temperature-gradient-induced instability in polymer films", Europhysics Letters, Oct. 15, 2002, vol. 6, No. 2, pp. 255-261.
Schaffer et al., "Thermomechanical Lithography: Pattern Replication Using a Temperature Gradient Driven Instability", Adv. Mater., Mar. 17, 2003, vol. 15, No. 6, pp. 514-517.
Voicu et al., "$TiO_2$ patterning using electro-hydrodynamic lithography", Soft Matter, 2007, vol. 3, pp. 554-557.

* cited by examiner c d

METHOD AND APPARATUS FOR THE CONTROLLED FABRICATION OF MICRO AND NANOSCALE STRUCTURES BY THERMOCAPILLARY LITHOGRAPHY

CROSS-REFERENCE TO RELATED APPLICATION

The current application claims priority to U.S. Provisional Application No. 61/200,219, filed Nov. 25, 2008, the disclosure of which is incorporated herein by reference.

STATEMENT OF FEDERAL SUPPORT

The U.S. Government has certain rights in this invention pursuant to Grant Nos. CTS0649474 and CBET0701324 awarded by the National Science Foundation.

FIELD OF THE INVENTION

The current invention is directed to a method and apparatus for fabricating micro and nanoscale structures; and more particularly for producing engineered temperature gradients configured to allow for the controlled growth of micro and nanoscale structures using liquefiable films by non-contact thermocapillary modulation.

BACKGROUND OF THE INVENTION

In a number of diverse industries, including microelectronics, biotechnology and microsystems, it is important to produce high resolution patterned structures on substrates. For example, high resolution patterned structures are necessary to produce integrated circuits. Presently, photolithography is the most commonly used process to produce these patterned structures on substrates.

Photolithography techniques involve exposing a photoresist to an optical pattern and using chemicals to etch either the exposed or unexposed portions of the photoresist to produce the patterned structure on the substrate. Because photolithography is only limited by the wavelength of light used to produce the optical pattern, it allows for the production of devices with very small features.

While conventional UV lithography offers unparalleled resolution for device fabrication, photolithography becomes increasingly complex and costly when sub-micron features are required. It is also not readily adaptable to the patterning of curved substrates or patterning of films consisting of materials which are not UV compatible. Accordingly, there is growing interest in alternative, less costly and more rapid patterning techniques for construction of micro-optic, photonic and optoelectronic devices. It has been shown, for example, that microcontact printing, micromolding, microembossing or nanoimprinting can fabricate components for MEMS devices more cheaply. (See, e.g., L. J. Guo, Adv. Mat. 19, 495 (2007) & E. Menard et al., Chem. Rev. 107, 1117 (2007), the disclosure of which are incorporated herein by reference.) Letterpress techniques have also been used to fabricate polymeric masks for resist-free printing of amorphous silicon thin film transistors whose performance is equivalent to those fabricated by conventional means. (See, e.g., S. M. Miller, et al., J. Vac. Sci. Tech. B 20, 2320 (2002) & S. M. Miller, et al., Appl. Phys. Lett. 83 (15), 3207 (2003), the disclosures of which are incorporated herein by reference.) Equally promising are techniques for the construction of microscale components by non-contact means such as electrohydrodynamic ink-jetting, whereby small volumes are jetted onto selective sites of a target substrate. (See, e.g., J. Park et al., Nature Materials 6, 782 (2007), the disclosure of which is incorporated herein by reference.) However, those techniques that depend on structure formation by deposition of material, like ink jetting, are inherently 2D in that the object or device to be patterned is constructed by adding and subtracting material layer by layer to achieve the final desired shape. These techniques therefore required multiple process steps. Those techniques which depend on molding technologies, by contrast, require a 3D mold whose shape must be pressed firmly into the film to be patterned. Necessary contact of the mold with the liquefied film leads to difficulties with adhesion and film detachment when removing the mold. Thermocapillary lithography, however, allows for controlled and true 3D construction of small micro and nanoscale patterns by non-contact means and in a minimal number of process steps.

The interest in inexpensive fabrication of either single structures or devices or large area pattern arrays has led a number of groups to investigate the use of natural fluid instabilities for non-contact patterning of molten polymer films. Specifically, during the past decade, three independent groups have reported experiments in which an ultrathin molten polymer film sandwiched in between two rigid substrates, as shown in FIG. 1, and subject to a vertical thermal gradient of order $10^6$-$10^{8}$° C./cm, can undergo spontaneous formation of nanopillars, nanospirals, or other 3D protrusions after several minutes or hours depending on the value of the thermal gradient, the viscosity of the molten film and various other geometric and material parameters. In all reported experiments, the structures were allowed to grow and make contact with the cooler target substrate after which the thermal gradient was removed. Upon removal of this gradient, the polymeric structures solidified in place after which the top surface was removed. (See, e.g., S. Y. Chou, et al., Appl. Phys. Lett, 75, 1004 (1999); S. Y. Chou and L. Zhuang, J. Vac. Sci. Technol. B, 17(6), 3197 (1999); E. Schäffer, PhD Thesis, Univ. of Konstanz, Germany (2001); E. Schäffer, et al., Adv. Mater. 15(6), 514 (2003); E. Schäffer, et al., Europhys. Lett., 60(2), 255 (2002); E. Schäffer, et al., Macromolecules 36, 1645 (2003); and J. Peng, et al., Polymer 45, 8013 (2004), the disclosures of each of which are incorporated herein by reference.)

Schäffer et al. not only conducted experiments, but postulated in 2001, and in subsequent papers, that the cause of the formation of these pillared arrays was due to a type of fluid instability associated with pressure buildup from interfacial reflection of acoustic phonons. (See, e.g., E. Schäffer, PhD Thesis, Univ. of Konstanz, Germany (2001), the disclosure of which is incorporated herein.) Their reasoning relied on a phenomenological model in which the internal radiation pressure in the polymer film was greatest beneath the areas of the polymer films experiencing protrusions. In this way, the destabilizing radiation pressure beneath the protrusions can exceed the stabilizing capillary pressure due to surface tension and these regions of the film will grow toward the top colder plate at the expense of the indentations from which mass is being removed.

The thermocapillary growth method described here differs significantly from the acoustic phonon growth method described by Schäffer et al. and includes a number of advantages. First, unlike the acoustic phonon method, the shaping process does not depend on the degree of reflectivity of the interfaces present, which may include liquid/solid, liquid/liquid or liquid/gas interfaces. Also, the thermocapillary technique does not depend on the speed of sound in the polymer film, which changes with temperature, pressure and the molecular weight of the polymer used. In fact, the thermocapillary growth method will work with any material that can be liquefied, not just polymer based films. And since the technique relies on film patterning by thermal gradients i.e. spatial and temporal variations of the temperature field, the actual value of the temperature fields used is not a constraining factor; that is, the values of the temperatures used for patterning can be suited to the material at hand since only thermal gradients are important to the shaping process. Secondly, for a given liquefied film subject to a specified temperature gradient, the thermocapillary technique is able to generate feature sizes smaller by a factor $(h_o/d_o)^{1/2}$, where $h_o$ is the thickness of the initial liquefied film and $d_o$ is the distance separating the warm and cooler substrates in the example shown in FIG. 1. Thirdly, film processing does not require flat or parallel substrates nor contact with an opposing substrate. Knowledge of the thermocapillary mechanism leading to pattern formation allows the operator to use a wide spectrum of supporting substrates (including those with curvature or substrates transparent to illumination or radiation) and allows process intervention at any time, either to stop the growth of structures which have achieved the desired height, spacing or shape, to refine the shaping process during growth, or to redirect the flow toward other directions during shaping. In addition, all the working parameters necessary for constructing shapes of a desired form are known material or geometric quantities, whereas the acoustic phonon model depends on a phenomenological parameter, Q or Q bar, called the acoustic quality factor, which is not known. This parameter must instead be obtained from a fitting procedure extracted for this purpose from additional experiments. Furthermore, the material that constitutes the film to be patterned does not need to undergo any change in its chemical properties as required by photolithographic patterning methods. In addition, patterns can be produced without chemical etching or optical projection techniques, the latter of which creates a fundamental physical limitation to the lateral resolution of the pattern based on the wavelength of light used.

The thermocapillary lithographic method can be contrasted with photolithographic techniques, which rely on photoinduced crosslinking or other chemical processes in order to distinguish those parts of the exposed film that can be removed or retained. Moreover, in the thermocapillary growth technique, the lateral resolution of the pattern can be actively controlled by the particular value (e.g. spatial and temporal) of the local applied thermal gradient, the material properties of the liquefied film and gas or liquid overlayer, or geometric parameters like $h_o$ or $d_o$. The value of the local applied thermal gradient can also be tuned actively and in situ, thereby allowing for formation of disparate feature sizes in one process step Unlike the acoustic phonon method, embossing methods or other conventional printing techniques, there is no requirement that the film to be patterned come into mechanical contact with the pattern template. Specifically, because the patterned structure grows by mass transfer from within the underlying film, and because this growth is triggered by the applied temperature gradient, there is no need for the structure to touch the pattern template at all. This is advantageous because physical contact with a mask or pattern can lead to complications in image separation.

Despite the intense interest in the use of acoustic phonons methods for film patterning, thus far no one has been able to manufacture working micro and nanoscale devices. Nor have the theories put forward thus far been able to adequately model the growth phenomenon such that controlled growth patterns can be formed. Accordingly, a need exists for a method and apparatus for the fabrication of 2D and 3D structures from liquefied films exposed to temperature gradients that will allow for the creation of predictable and ordered micro and nanoscale structures.

SUMMARY OF THE INVENTION

In one embodiment, the current invention is directed to a method of producing a patterned film. In one such embodiment the method includes the steps of:

Providing a substrate surface for supporting the liquefiable film to be patterned.

Depositing at least one liquefiable film onto the film supporting surface.

Providing a three-dimensional plan of a desired device or array of devices.

Designing a temperature gradient field configured to generate controlled thermocapillary forces in the film, which are designed to cause an engineered mass transfer in the film such that a three-dimensional pattern is formed in the film corresponding to the three-dimensional plan. In this embodiment, the temperature gradient field is designed using a modeling process based on an interface evolution calculation that is configured to model the dominant thermocapillary forces, including at least the tangential shear stresses acting on the moving interface created by the temperature gradient field, which promote the growth of the three-dimensional pattern, and the capillary forces inherent to the film, which repress formation of the three-dimensional pattern.

Exposing the film to the temperature gradient field to produce the three-dimensional pattern in the film.

In another embodiment, the patterning conditions are such that the film is a Newtonian viscous polymeric fluid with viscosity $\eta=\eta(T_2)$, the fluid dynamics and heat transfer properties of the film approximate the slender gap limit, and the heat transfer of the film reduces to a 1D conduction equation in the direction perpendicular to the supporting substrate.

In still another embodiment, the method includes providing at least two surfaces, including a substrate surface for supporting the film to be patterned, and at least one upper surface provided opposite to the substrate surface. In such an embodiment, the method includes exposing a temperature distribution field onto at least one of the interfaces that comprise the liquefied film.

In yet another embodiment, the spacing between the substrate surface and the mounting surface is within the range of 10 nm to 10,000 nm.

In still yet another embodiment, the method further includes liquefying the film either before or during exposure to the temperature gradient field.

In still yet another embodiment, the method further includes the step of solidifying the film after producing the three-dimensional pattern.

In still yet another embodiment, the film thickness is within the range of 10 nm to 1000 nm.

In still yet another embodiment, the film contains one of either an organic polymer, a glassy polymer, or an organic oligomer.

In still yet another embodiment, the material to be patterned is formed of at least two layers, in which case the bilayer consists either of a gas and liquid layer or two liquid layers.

In still yet another embodiment, a temperature gradient is induced by disposing at least one additional surface in close proximity to the substrate. In such an embodiment, the temperature gradient field may be formed by spatially controlling the topography of at least one of the surfaces, by spatially controlling the surface energy of at least one of the surfaces and/or by spatially controlling the temperature of at least one of the surfaces. In another such embodiment, at least one of the substrate surfaces and/or the upper surface are moved relatively to each other for at least a fraction of the time during which the film is exposed to the temperature gradient field.

In still yet another embodiment, the temperature gradient may be formed by applying a remote spatial heating or cooling technique, such as, for example, a source of radiative heating or thermoelectric cooling whose spatial and temporal temperature distribution can be externally controlled so as to vary the imposed temperature distribution on the liquefied film.

In still yet another embodiment, at least one additional field selected from electrical, magnetic, electromagnetic, mechanical and evaporational effect is employed to support or enhance the patterning process.

In still yet another embodiment, the temperature gradient field applies at least one temperature gradient between the substrate surface and the at least one upper surface.

In another embodiment, the current invention is directed to an apparatus for producing a patterned film. In one such embodiment, the apparatus at least includes:
  A substrate having a substrate surface for supporting the liquefiable film to be patterned.
  A temperature gradient field disposed in proximity to the liquefiable film. It is to be understood that the temperature gradient field is designed to generate controlled thermocapillary forces, which cause an engineered mass transfer in the film such that a pre-selected three-dimensional pattern is formed in the film.
  The temperature gradient field is configured in accordance with an interface evolution calculation designed to at least model the thermocapillary forces. The thermocapillary forces calculated must include at least the tangential shear stresses created by the temperature gradient field, which promote the growth of the three-dimensional pattern, and the capillary forces inherent to the film, which repress formation of the three-dimensional pattern. Additional forces often referred to as wetting or dewetting forces (via the inclusion of disjoining pressure terms) can also be easily incorporated into the evolution equation for ultrathin liquefied films.

In still another embodiment, the apparatus comprises at least one additional surface disposed in oppositional proximity to the substrate. In such an embodiment the spacing between the substrate surface and the at least one upper surface is preferably within the range of 10 nm to 10,000 nm. In still such another embodiment, the temperature gradient field may be formed by disposing a pattern on at least one of the substrate surfaces and at least one upper surface. In such an embodiment, the pattern is formed by one of topographic features, spatially varying surface energy, and a spatially varying thermal conductivity. In yet such another embodiment, the temperature gradient field is produced by differentially heating at least one of the surfaces. In such an embodiment, the apparatus includes at least first and second temperature controllers, the first temperature controller being in thermal communication with the substrate surface, and the second controller being in thermal communication with the at least one upper surface, wherein the at least first and second temperature controllers are adapted to generate a temperature gradient between the substrate surface and the at least one upper surface.

In still yet another embodiment, the temperature gradient may be formed by applying a remote spatial heating technique, such as, for example, a spatially controllable set of mirrors or other reflecting surface array in order to modulate the illuminated intensity of laser or other light source to be used for the engineering temperature field.

In still yet another embodiment, the substrate is a semiconductor material.

In still yet another embodiment, the apparatus includes a means for applying an additional force selected form the group consisting of electrical, magnetic, electromagnetic, mechanical and evaporational to the film.

In still yet another embodiment, the apparatus and film are constructed such that the film is a Newtonian fluid, the polymer viscosity is a constant in accordance with $\eta=\eta(T_2)$, the fluid dynamics and heat transfer properties of the film approximate the slender gap limit, and the heat transfer of the film reduces to a 1D conduction equation along the z-axis of the film (i.e. the axis which is oriented perpendicularly to the substrate supporting the liquefiable film).

In another alternative embodiment, the current invention is directed to a method of designing an engineered temperature gradient field configured to controllably direct a mass transfer in a film such that a pre-selected three-dimensional pattern is formed.

In one such embodiment, the method includes:
  modeling the thermocapillary forces generated in the film by the temperature gradient field using an interface evolution calculation that at least determines the tangential shear stresses created by the temperature gradient field, which promote the growth of the three-dimensional pattern, and the capillary forces inherent to the film, which repress formation of the three-dimensional pattern.

In still another embodiment, the mass transfer conditions are selected such that the film is a Newtonian fluid, the polymer viscosity is a constant in accordance with $\eta=\eta(T_2)$, the fluid dynamics and heat transfer properties of the film approximate the slender gap limit, and the heat transfer of the film reduces to a 1D conduction equation along the z-axis of the film.

In yet another embodiment, the step of modeling is configured to account for proximity effects during the formation of the three-dimensional pattern.

BRIEF DESCRIPTION OF THE FIGURES

Various examples of the present invention will be discussed with reference to the appended drawings. These drawings depict only illustrative examples of the invention and are not to be considered limiting of its scope.

DETAILED DESCRIPTION OF THE INVENTION

Introduction

Figure 1:
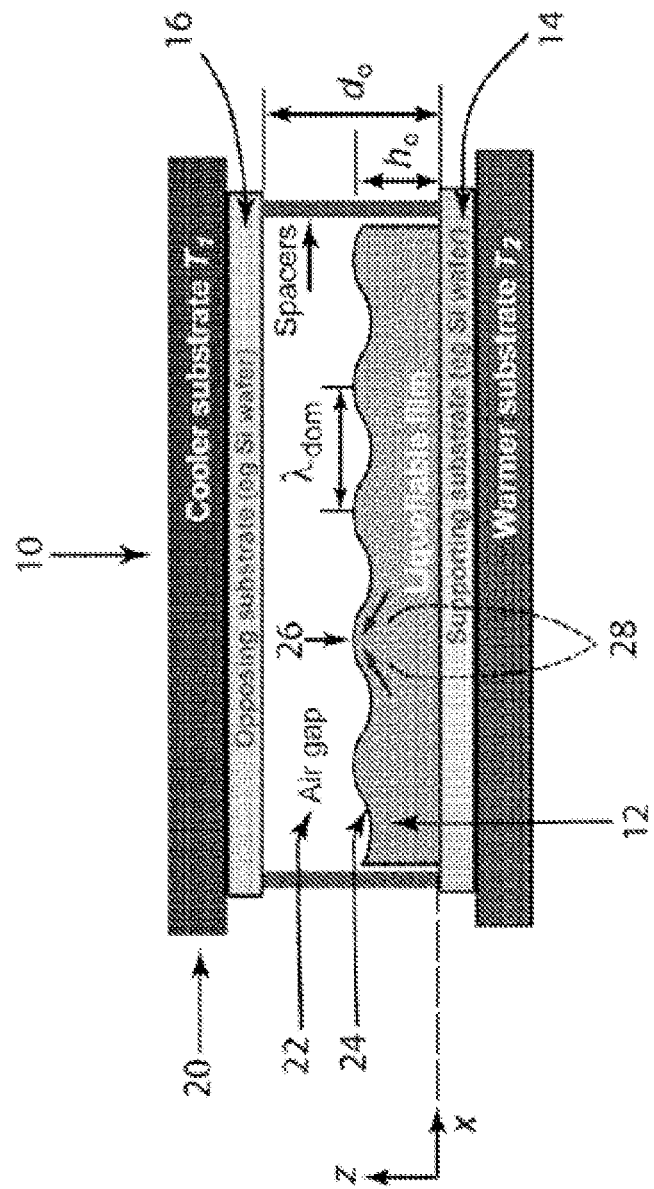
FIG. 1 is a schematic diagram of a conventional unpatterned thermocapillary lithography device.

The present invention relates to an apparatus and method for producing micro and nanoscale patterned structures from thin films by a mass transfer flow process. In particular, there is provided a method and apparatus for controlling the non-contact patterning of liquefied films based on a novel understanding of the mechanism of temperature gradient induced mass transfer in thin films. Hereinafter, the temperature gradient induced mass transfer growth technique on which the method of this invention is based shall be referred to as "thermocapillary lithography" or "TL". Thermocapillary lithography refers to a method and device used to fabricate 2D or 3D structures from a thin liquefiable film subject to thermal gradients that can be applied, on demand, with desired spatial and temporal resolution.

The current invention depends on the discovery that the thermocapillary lithography technique, which relies almost exclusively on imposed thermal distributions along a gas/liquid or liquid/liquid interface of a supported or non-supported film, is able to produce well-ordered 2D and 3D structures by mass transfer in a thin liquefied film. Thermal distributions along the surface of a liquefied film generate spatial gradients in the surface tension of the film. Such gradients can be tailored to generate interfacial stresses either to elongate or depress selective regions of the film by inducing mass transfer from warmer to cooler regions (or vice versa depending on the sign of the thermal coefficient of surface tension for the material used). The discovery is that properly engineered thermocapillary stresses can be imposed to selectively grow or depress surface deformations with small or large aspect ratios in a liquid film thereby shaping the interface on demand into 3D structures, which rapidly solidify when the thermal gradients are removed. The current invention utilizes this new insight to provide an apparatus and method of controllably and selectively stimulating and repressing the growth and evolution of 2D and 3D shapes from a thin liquefied film technique such that complex devices can be designed and fabricated into engineered structures with different heights and separation distances preferably in a single process step. More specifically, the current invention provides an apparatus and method for designing engineered temperature gradient fields capable of controlling for, and taking into account, proximity effects during the growth and evolution of adjacent structures, which in turn allows for the production of technologically significant micro and nanoscale devices in a number of fields. The engineered thermal maps can be provided by computer aided design or other software techniques. This method of temperature gradient patterning shall be referred to hereinafter as "Patterned Thermocapillary Lithography" or "PTL".

Description of Conventional Thermocapillary Lithography

Before the patterned thermocapillary lithography method of the current invention can be fully explained, it is necessary to first examine the operation of the underlying thermocapillary lithography thin film mass transfer growth process.

One embodiment of a conventional TL apparatus (10) for producing the patterned films from mass transfer within a thin film subjected to a large temperature gradient is provided in FIG. 1. As shown, in this embodiment a film (12) is formed on a substrate (14), opposed by a second temperature gradient inducing surface or top plate (16). The substrate and the top plate are brought into thermal contact with temperature control means (18 & 20), which during operation are designed to produce a temperature gradient between the substrate and the top plate. A medium (22) is present between the film (12) and the top plate (16), which at least has a thermal conductivity that is different from the film material, and allows for the film to move therein. For example, this medium (22) can be vacuum, air, or any other liquid or liquefiable or soft material.

During operation, when different temperatures are applied to the substrate (14) and the top plate (16), it results in a temperature gradient at the interface (24) of the film (12) and medium (22) such that regions (26) of the interface closer to the top plate are slightly cooler than adjacent regions. As a result, these protruding regions (26) cause a tangential (i.e. lateral) stress (28) called a thermocapillary stress to develop along the interface, which drives fluid either from the warmer to the cooler regions or vice versa, depending on the sign of the thermal coefficient of surface tension for the material used. The closer a protrusion (26) is to the top plate (which, in this example, is the source of the cooler temperature), the cooler it becomes and the higher the local surface tension becomes, thereby strengthening this effect and increasing the degree of pull or stress on the adjacent liquid regions. As a result, a very small fluctuation in height at the interface (24) can grow into a tall pillar or other elongated shape given sufficient time. Once the molten patterns have attained the desired local shapes and heights, the thermal gradient can be turned off and the liquid solidified so that the pattern rapidly affixes in place.

Figure 2:
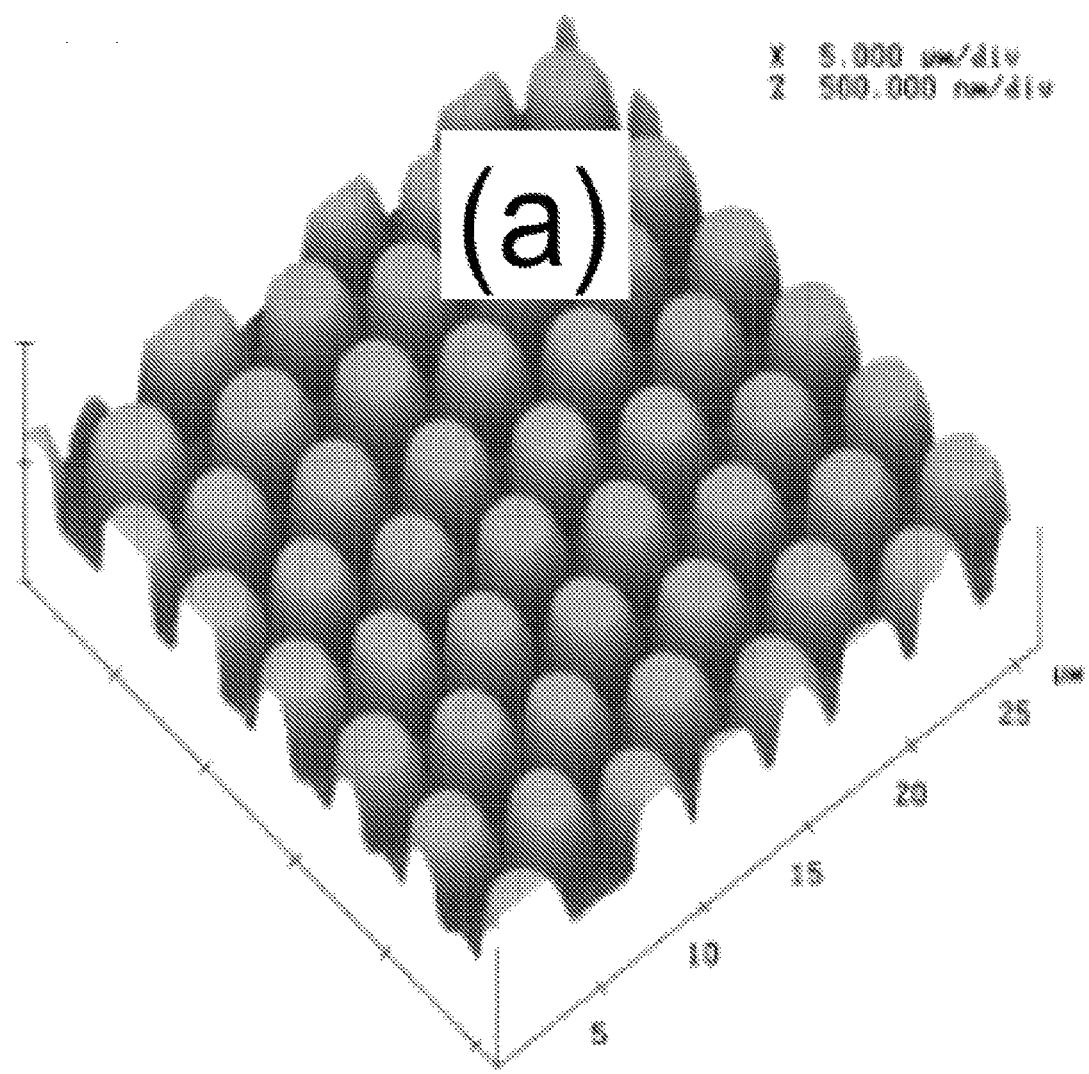
FIG. 2 provides a series of AFM images of 3D structures grown by a conventional thermocapillary lithography apparatus (taken from (a) S. Y. Chou et al, *J. Vac. Sci. Technolo. B*, 17, 3197 (1999); (b) E. Schäffer, Ph.D. thesis, Universität Konstanz, 2001; and (c) J. Peng, et al., *Polymer*, 45, 8013 (2004), the disclosures of each of which are incorporated herein by reference)
Figure 2:
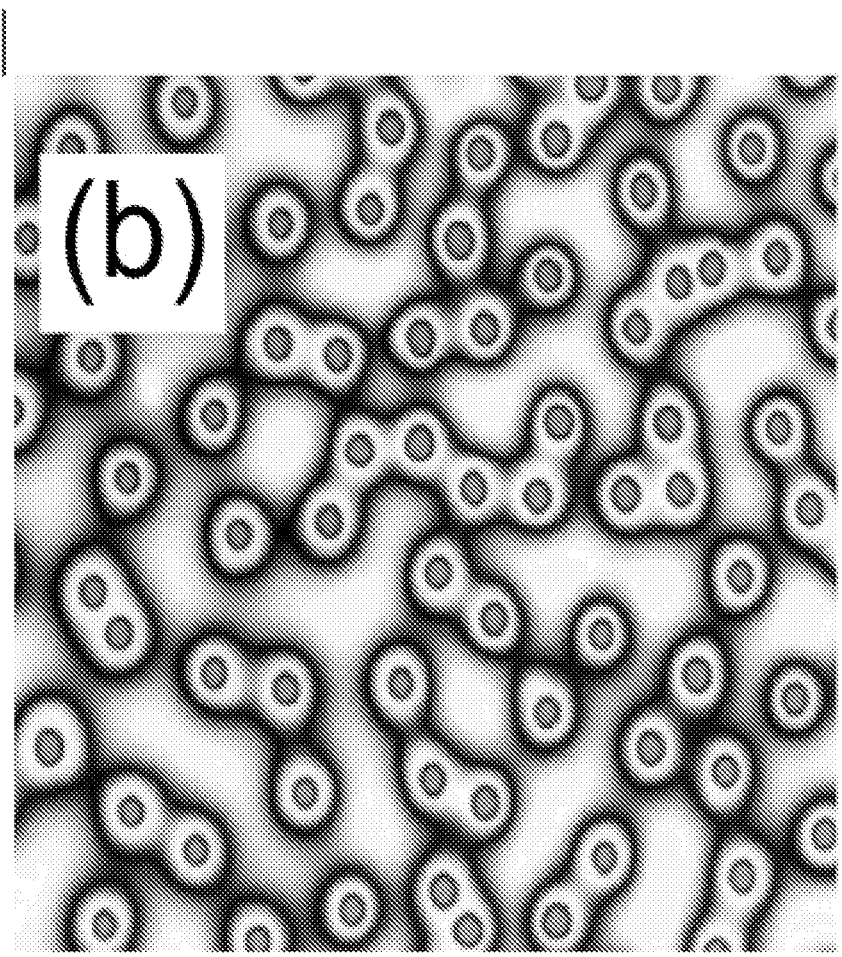
Figure 2:
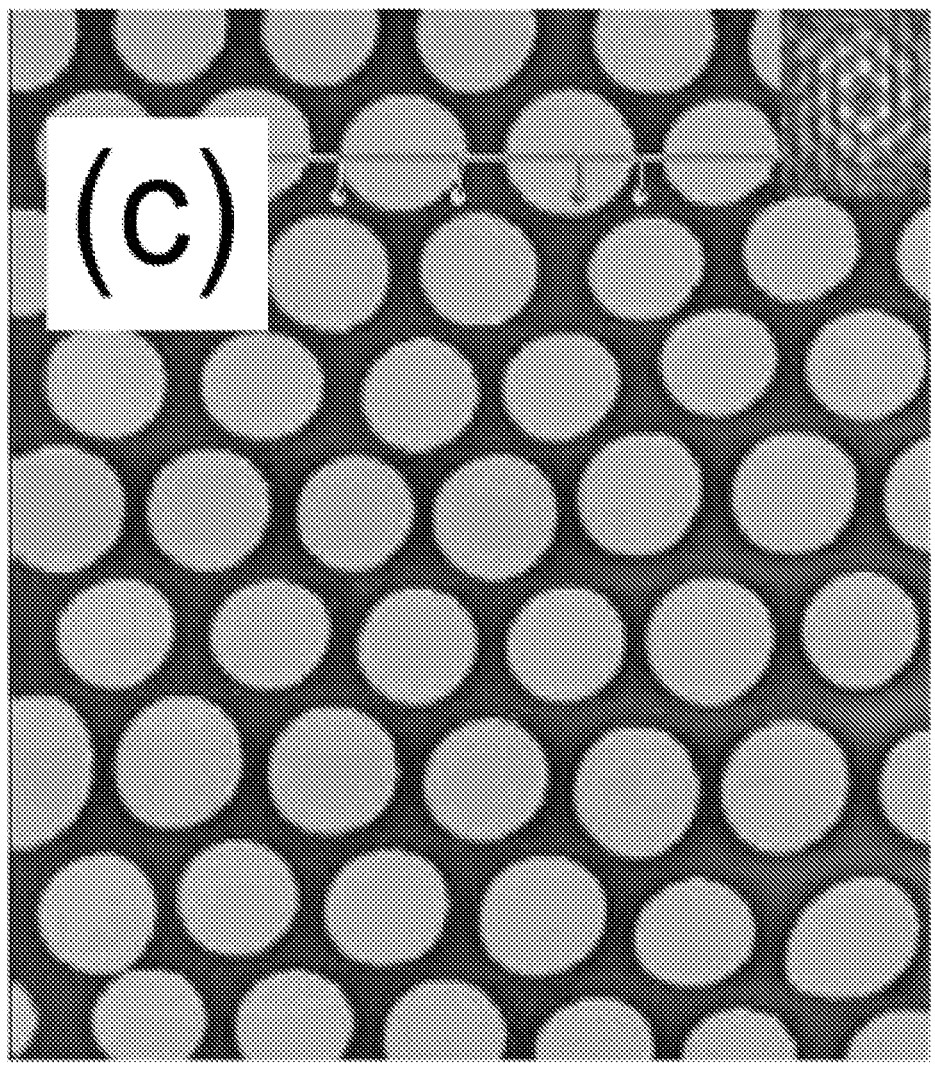

In one example of a TL growth process setup, a thin molten film of polystyrene (PS) or poly(methyl methacrylate) (PMMA) of thickness $h_o$ (~10-5,000 nm) would be spun cast on the substrate and inserted in between two flat and parallel silicon or other material wafers separated by a distance $d_o > h_o$. The film would then be subject to a temperature difference $\Delta T = T_2 - T_1$. Preferably, both temperatures would be held above the polymer solidification temperature (approx. 100° C.) during the course of the growth. If the temperature of the top plate is held at or below the polymer solidification temperature, then growth of protrusions will still occur until solidification is established. Typically, $d_o/h_o$ ranges from about 2-20; air or other fluid gap above the liquefiable film allows its surface to be deformed as it moves into the overlying phase. Although $\Delta T$ can be as small as desired since there is no critical value required for the process to work, it is typical to use values in the range of 1-100° C. This temperature difference applied across the narrow gap $d_o$ between the substrates establishes a large thermal gradient of order $10^6$-$10^{8}$° C./cm. As explained in the preceding section, under these conditions, free surface films, which are initially smooth and flat, are observed to undergo an instability, which generates self-assembling nanopillars with mean spacing approximately 1-10 micrometers which are spontaneously attracted and drawn toward the cooler substrate. FIG. 2 provides AFM images of some exemplary solidified structures formed using an unpatterned TL methodology.

As will be discussed in greater detail below, the protrusion height and growth rate as well as column diameters and spacings, depend sensitively on both material and geometric parameters. Material parameters include the interfacial tension between the fluid layers (gas/liquid or liquid/liquid layers), the viscosity of the fluid layers, the response of the interfacial tensions with temperature, and the thermal conductivities of the fluid layers. For thicker fluid layers, the densities of the fluids is also relevant. Geometric parameters include the applied local temperature gradient (both vertical and lateral), the local thickness of the liquefied film, and the local separation distance between upper and lower substrates. If there is no other substrate other than the supporting substrate for the liquefied film, then the important geometric parameter is the thermal distribution imposed on the liquefied film by means of non-contact radiative, thermoelectric or other source of thermal field generation.

Discussion of Patterned Thermocapillary Lithography

The embodiment described above corresponds to a TL apparatus that applies a laterally homogeneous externally applied temperature gradient to the growth film via two closely spaced surfaces. While it is true that the TL apparatus shown in FIG. 1 can produce 2D and 3D features, in such a system, where the temperature gradient is imposed by two substrates disposed in opposition to one another that are planar, parallel and unpatterned, the temperature gradient is assumed to be substantially uniform across the gap there between. Under such a substantially uniform temperature gradient, the surface features will grow in accordance with the underlying physical properties of the materials and a hydrodynamic instability representing the competition in forces exerted on the liquefied interface, namely the forces of thermocapillarity (thermal variations in surface tension) and capillarity (i.e. local value of the surface tension). Accordingly, while the overall geometry of the features produced using may demonstrate an ordered geometry, such as, for example, hexagonal, square, spiral or rectilinear patterns, it is not possible to predict the exact growth location of any single feature. As a result, it is not possible to use such a spontaneous growth process to fabricate micro and nanoscale devices requiring a specific spatial and orientational distribution of 2D and 3D structures, nor it is possible to alter the shape produced in this way, which resembles pillar-like elongations. It is also not possible therefore to overlay features constructed in one step with those constructed in a previous step.

In contrast, the current invention is directed to a growth apparatus and method that applies a heterogeneous temperature field to the film, and more particularly to a method and apparatus for engineering the temperature gradients of the heterogeneous temperature field such that the growth and shape of the structures formed is predictable and controlled.

Figure 3:
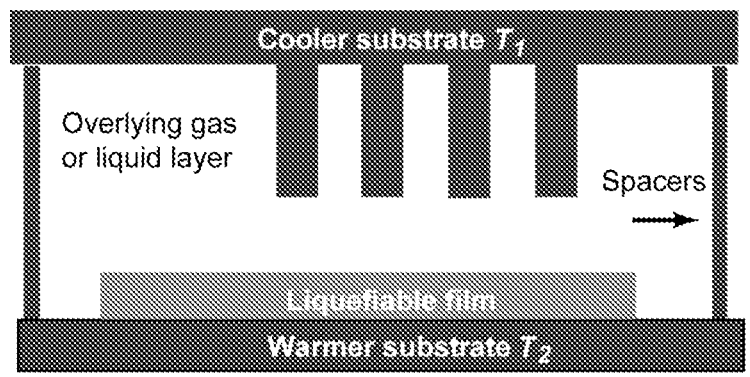
FIG. 3 is a schematic diagram of a second thermocapillary lithography device that could be used in accordance with the present invention.
Figure 3:
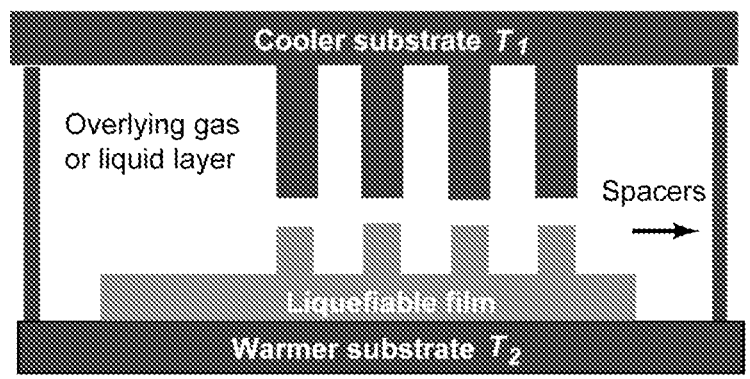
Figure 3:
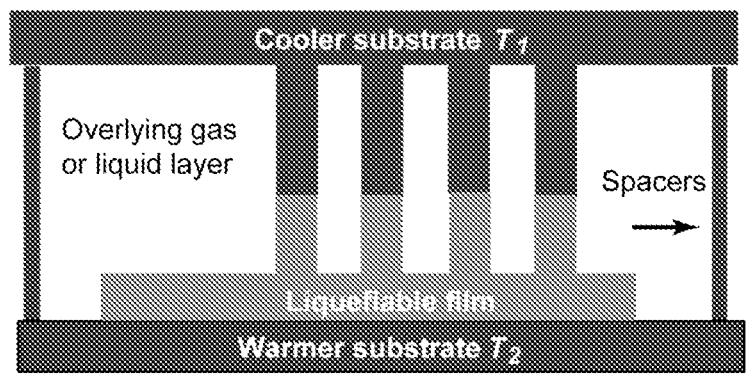
Figure 4:
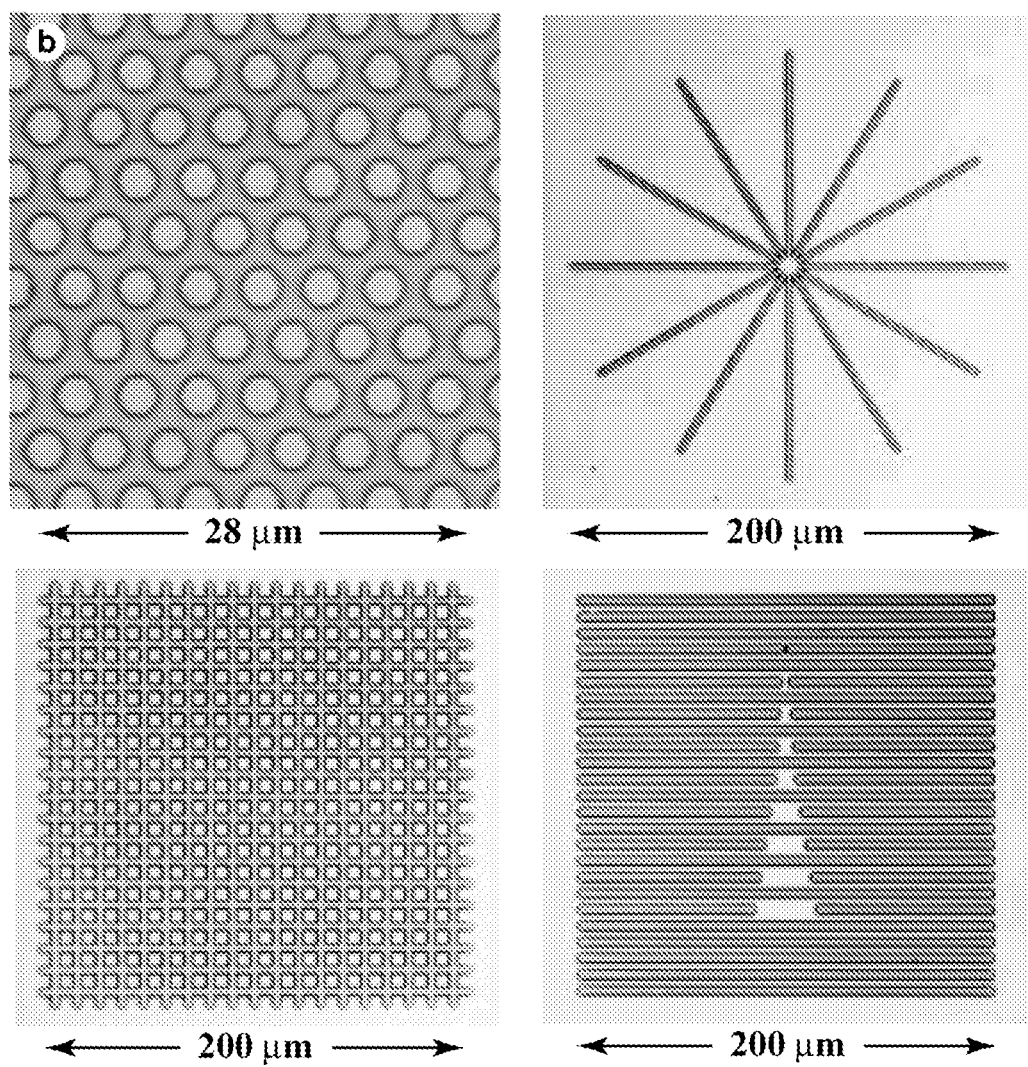
FIG. 4 provides a series of AFM images of 3D structures grown by a patterned thermocapillary lithography apparatus in accordance with the prior art (taken from E. Schäffer, et al., *Macromolecules*, 36, 1645 (2003), the disclosure of which is incorporated herein by reference)

Theoretically there are many ways of producing a heterogeneous temperature field to modify the inherent or uncontrolled thermocapillary induced instability of the film. For example, Schaffer et al. suggested that lateral temperature gradients may be introduced into a conventional two surface TL device by forming a lateral pattern on one or both of the substrate or top surfaces, as shown in FIG. 3. (See, E. Schäffer et al., European Patent Publication No. 1339550 B1, the disclosure of which is incorporated herein by reference.) In such an embodiment, one or both of the substrate and top surface is provided with a topographical pattern. Such patterns can be produced by any suitable conventional technique, such as, for example, by electron beam lithography. As shown in FIG. 3, in an embodiment wherein the top surface is provided with a topographically pattern, the externally applied temperature difference causes the film undulations to focus in the direction of the strongest temperature gradient, which naturally occur beneath the protrusions since these portions of the top surface are in closer proximity to the surface of the liquefied film. It has been proposed that using such patterned surfaces would drive the film to form a pattern corresponding to the topographically patterned top plate, and that this pattern would be retained upon solidification of the liquefied film. This patterned thermocapillary lithography in theory provides a simple means of pattern replication in liquid films since the top pattern can be mirrored onto the liquid film when solidified. FIG. 4 demonstrates some patterns formed by this general patterned replication technique by conventional means.

However, in order to create operative micro and nanoscale devices, it is necessary to be able to controllably locate and grow film features with at least the precision of comparable micro and nanoscale device fabrication techniques, such as, for example, photolithography. In particular, for TL to become a useful technique for device fabrication, it is necessary that one have the ability to engineer the temperature gradient field to be applied to the film such that all relevant competing forces, such as, for example, proximity effects are controlled for during the entire evolution of the structures that make up the overall device. In order to achieve this level of control, it is necessary to have a very precise understanding of the underlying growth mechanism.

The current invention is directed to an apparatus and method of engineering a temperature gradient field such that true "Patterned Thermocapillary Lithography" capable of producing optical quality devices is possible. PTL is made possible with the apparatus and method of the current invention, because of the development of a complete and accurate description of the mechanism underlying the propagation and evolution of growth in these thin liquefied films under large temperature gradients. Specifically, it has been surprisingly discovered that the mechanism for the formation of the microscale or nanoscale pillars by TL is connected to the fact that regions of the film interface exposed to higher thermal gradients are driven by a balance of forces to undergo a mass transfer, thereby leading to the growth of 2D and 3D surface features.

For example, in the embodiment of a PTL device shown in FIG. 3, regions of the film interface closer to the upper substrate are slightly cooler than adjacent regions. As a result, these protruding regions of the liquefied film exert a tangential stress called a thermocapillary stress along the interface, which drives fluid from the warmer to the cooler regions or vice versa, depending on the thermal coefficient of surface tension for the material used. For liquids drawn to cooler regions, the closer a protrusion becomes to the top boundary, the cooler the film interface becomes, thereby strengthening this effect and increasing the degree of pull on the adjacent liquid regions. As a result, a very small fluctuation in height at the surface of the liquefied film will elongate sufficiently to contact the opposing plate given sufficient time. If the opposing plate is slowly and progressively moved further away from the liquefied film, the elongations will continue to follow the opposing plate so long as there is material available to feed the growing elongation. As will be explained in greater detail in later sections, although the embodiment of the PTL device shown in FIG. 3 accomplishes this patterned mass transfer by the disposition of one topographically patterned surface in close proximity to a substrate on which a liquefied film has been deposited, there are many different methods of subjecting a liquefied film to the same TL driving force without using topographical features, or even a second proximal upper surface. Indeed, the only requirement for inducing PTL growth on a thin liquefied film in accordance with the current invention is the application of an engineered temperature gradient field based on a balance of two dominant forces, namely the thermal stresses that drive structure growth and the capillary forces that resist structure growth.

That thermal fluctuation and the resulting change in surface tension is the principal physical mechanism responsible for the growth of 3D structures in thin liquefied films subject to a large transverse thermal gradient is a novel insight into the TL process. It specifically challenges the prevailing explanation for patterned structure formation, which relies on modulation of a surface radiation pressure induced by reflection of acoustic phonons from the gas/liquid and liquid/solid interfaces comprising the liquefied film. (See, e.g., European Patent Publication No. 1339550 B1, cited above.) E. Schäffer et al., propose that this acoustic phonon normal stress (also known as a surface radiation pressure) opposes capillary forces and enhances the growth of protrusions. Such a process, however, requires coherent phonon propagation within a molten amorphous polymer films and an average phonon mean free path at least as large as the film thickness. Experiments by other groups have shown that solid nanoscale polymer films at temperatures $-193 \leq T \leq 27°$ C. are able to support phonon attenuation lengths of about $O(10^1-10^2)$ nm at frequencies in the 100 GHz range. However, such long propagation lengths have never been demonstrated at higher temperatures where the polymer film is liquefied and are considered unlikely in amorphous molten films (for which the glass transition temperature is approximately 100-120° C.) since such liquefied films exhibit no internal structural features that can support long range propagation of sound waves. Moreover, even were the prior art technique correct, the acoustic phonon method proposed by this conventional understanding requires the introduction of a phenomenological reflectivity coefficient, which makes it difficult to use as a predictive technique for patterning a temperature gradient field for the production of a specific device.

Another theory concerning the mechanism of growth in thicker liquid films (cm to mm) subject to thermal gradients has been postulated. In summary, it has been shown that these thicker films can develop periodic cellular patterns through Rayleigh-Bénard (RB) or Bénard-Marangoni (BM) instability. (See, e.g., R. F. Probstein, *Physicochemical Hydrodynamics: An Introduction* (Wiley & Sons, New York, 1994), $2^{nd}$ ed.) These instabilities, however, always generate very shallow corrugations not pillar-like or other elongated protrusions. Onset of instability leading to such shallow corrugations also requires that the critical Rayleigh number $Ra_c$ for buoyancy driven flow (which scales as $h^4_o$) or the critical Marangoni number $Ma_c$ for thermocapillary flow (which scales as $h^2_o$) exceed 660-1700 or 50-80, respectively, depending on boundary conditions of the apparatus. For the thin liquefied films of interest to patterned thermocapillary lithography, $Ra \approx 10^{-16}$ and $Ma \approx 10^{-8}$, ruling out these two mechanisms as possible causes for pillar formation in films subject to vertical thermal gradients.

A lesser known deformational instability leading to more pronounced structures has recently been observed in liquefied films whose thickness is several tens to hundreds of micrometers (e.g. $50 \leq h_o \leq 250$ μm) in which the thermocapillary stress is counterbalanced by both capillary and gravitational forces. For film thicknesses in this range, hydrostatic forces caused by gravity are equally important as capillary forces in repressing structure formation. Onset of instability requires that the inverse dynamic Bond number $D_c = \gamma_\tau \Delta T_{film}/\rho g h^2_o \geq \frac{2}{3}(1+F)^{-1}$, where $\rho$ is the liquid density, $\gamma_\tau = |\delta\gamma/\delta T|$, $\gamma$ is the liquid surface tension, $\Delta T_{film}$ is the temperature drop across the liquid layer, $F=(1-\kappa/(D+\kappa-1)$ is an order one constant, where $D=d_o/h_o$, and $\kappa = \kappa_{air}/\kappa_{polymer}$ is the ratio of thermal conductivities of the gas and liquid layers. Parameter values for the TL method using nanofilms, however, reveal that $D_c \geq O(10^7)$ and $G \sim O(10^{-14})$, far beyond regimes of instability previously investigated in which $D_c \sim O(10^{-1}-1)$ and $G \sim O(10^{-1}-10^2)$. Therefore, it has now been surprisingly discovered that a new type of deformational instability exists in nanoscale liquefiable films, which has profound consequences for technological applications since this new type of instability allows structure formation in liquefiable films with much large aspect ratios. Specifically, based on the understanding that thermocapillary stresses play a critical if not dominant role in the process, the current invention presents an apparatus and method that can be used to control the formation and evolution of 2D and 3D structures from liquefied nanofilms based on thermocapillary lithography with precision using engineered temperature gradient fields/patterns.

To generate the engineered temperature gradient fields the current invention provides a novel interface evolution equation, which is capable of modeling the growth rate and profile for a structure depending on two factors:
  interfacial temperature variations, which generate dominant tangential shear stresses, which in turn promote the growth of pillars toward a target (e.g. opposing) plate; and
  capillary forces, which are based on the underlying physical properties of the materials being use, and which repress formation of additional surface area.

Accordingly, using this modeling method, it is possible to determine the "interfacial temperature variations" or temperature gradients necessary to create a specific structure given a particular material. This method can be referenced as the Thermocapillary Model ("TC"), where thermal variations are transmitted to a liquefiable film by conduction, convection or radiation. The derivation of the interface equation corresponding to thermocapillary flow within an ultrathin polymer film driven by thermal modulation of the polymer surface tension is lengthy and not reproduced here; however, a more complete explanation can be found in M. Dietzel & S. M. Troian, Phys. Rev. Let., 103, 074501 (2009), the disclosures of each of which are incorporated herein by reference.)

The most notable assumptions of the modeling equation (consistent with experiments to date) are as follows:
(i) the liquefied film is modeled as a Newtonian fluid since the film shear rates are very small;
(ii) the liquefied film viscosity is assumed to be constant in accordance with $\eta = \eta(T_2)$;
(iii) the fluid dynamics and heat transfer are well approximated by the slender gap limit for which, $\epsilon^2 = (h_o/l_o)^2 \le (h/l_o)^2 < (d_o/l_o)^2 << 1$ and $\epsilon Re << 1$, where the Reynolds number Re is based on the initial film thickness $h_o$ (for a full description see, L. G. Leal, *Fluid Mechanics and Convective Transport Processes*, Cambridge Univ. Press, 2007); and
(iv) for the experimental assemblies examined, the heat transfer through the gas and liquefied film layers reduces to a 1D conduction equation along the axis which lies perpendicular to the plane of the supporting substrate.

It should be understood that these assumptions are not required for the operation of the PTL growth technique, and that one of ordinary skill in the art would be able to carry out equivalent evolution modeling using other system assumptions that extend beyond the "slender gap limit" assumptions used herein. In particular, the same principles and methodology would govern films subject to dominant thermocapillary stresses in the so-called Stokes flow or creeping flow limit.

Using these assumptions, it is possible to derive an interface evolution modeling equation for the evolving film height h(x,y,t), normalized to the film thickness of the initial liquefied film $h_o$, namely, $$H(X,Y,\tau) = h(x,y,t)/h_o \quad \text{Eq. 1}$$

to account for variations in interfacial temperature that develop along the evolving interface (such as the temperature gradients developed in the TL process). As discussed, such interfacial temperature variations generate tangential shear stresses, which promote the growth of pillars toward the opposing plate. Capillary forces, which repress formation of additional surface area, are incorporated in the model through a normal stress boundary condition. The resulting evolution equation is given by:

$$\frac{\partial H}{\partial \tau} + \nabla_\| \cdot \left( \frac{\kappa \overline{Ma} H^2}{2[D+(\kappa-1)H]^2}(D\nabla_\| H - H\nabla_\| D) + \frac{H^3}{3\overline{Ca}}\nabla_\|^3 H \right) \quad \text{Eq. 2}$$

This equation is valid for spontaneous formation of multiple elongations when the two substrates (i.e. supporting substrate and target or opposing substrate) are either unpatterned ($\nabla_\| D = 0$) or for controlled placement of individual or multiple structures when the opposing substrate is patterned ($\nabla_\| D \ne 0$).

Figure 9:
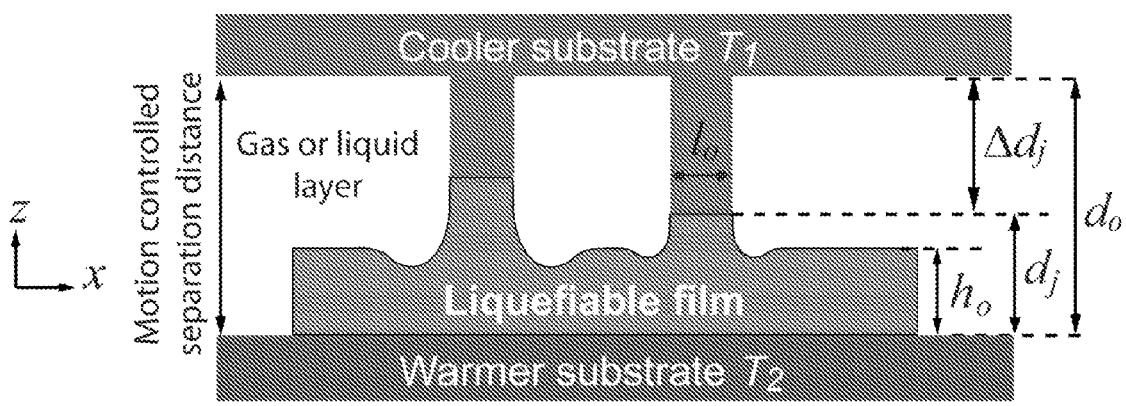
FIG. 9 is a schematic diagram of a third thermocapillary lithography device that could be used in accordance with the present invention for which numerical simulation results in accordance with typical experimental parameters are provided below.

In this equation, the dimensionless variables are themselves defined by $(X,Y,Z) = (x/l_o, y/l_o, z/h_o)$, where $l_0$ is a characteristic lateral feature size such as $\lambda_{dom}$ shown previously in FIG. 1 or the length scale $l_0$ defined by the topology of the upper substrate shown in FIG. 9, $\nabla_\| = \partial/\partial X, \partial/\partial X, [H, D_o, D, D_j, \Delta D_j] = [h(x,y,t)/h_o, d_o/h_o, d(x,y)/h_o, d_j/h_o, \Delta d_j/h_o]$ where D(X,Y) defines the surface topology of the upper wafer as shown in FIG. 9, $\tau = t\, u_c/l_o$, where t is real time, $\kappa = \kappa_{air}/\kappa_{polymer}$ denotes the thermal conductivity ratio and, $\overline{Ma} = \epsilon \gamma_T \Delta T/(\eta u_c)$ and $\overline{Ca} = \eta u_c/(\gamma \epsilon^3)$ denote the modified Marangoni and capillary numbers. Additionally, $\gamma_T = |d\gamma/dT|$ denotes the absolute value of the variation in surface tension with temperature (where $d\gamma/dT$ can be positive or negative), $\Delta T = T_2 - T_1$ and $u_c = (4\pi)^2 \epsilon \gamma h_o^2/(3\eta \gamma^2_{max})$ is the characteristic horizontal speed established by thermocapillary flow. During the modeling efforts described by the instance shown in FIG. 9, material properties are evaluated at $T_2$. As will be understood, evaluation of material properties at other system temperatures is straightforward, as is the inclusion of the full thermal dependence function for various material properties.

In addition to the evolution equation above, the PTL modeling method of the instant application can also be used to calculate the characteristic scale $\lambda_{dom}$, which refers to the wavelength of the dominant (dom) growth mode, and is obtained from linear stability analysis of structure growth:

$$\lambda_{dom}^{TC} = 2\pi h_0 \sqrt{4\gamma h_0/(3\kappa d_0 \gamma_T \Delta T)(d_0/h_0 + \kappa - 1)} \quad \text{Eq. 3}$$

The import of Eq. 2 is that it provides a mathematical description of the competitive forces at work in the TL process. Notably that the evolving film thickness $H(X,Y,\tau)$ (i.e., the formation of 2D and 3D surface features) is controlled by the competition between the thermocapillary term (preceded by $\overline{Ma}$), which drives fluid toward cooler (warmer) protrusions when $d\gamma/dT$ is negative (positive), and the capillary term (preceded by $\overline{Ca}^{-1}$), which represses formation of additional surface area. As previously discussed, gravitational forces are negligibly small for nanofilms of the thickness utilized during TL which allows formation of high aspect ratio structures. In turn, Eq. 3 defines the characteristic size and spacing of features grown under any particular balance of these forces, and may be used to determine the conditions necessary to grow a structure of a desired size, and the size limitations on growing structure for any particular system, i.e., the resolution possible for a growth system.

In turn, using the above description of the growth of thin liquefied films under large temperature gradients, it is possible to simulate the growth of 2D and 3D surface features from mass transfer in the film when exposed to a system having a well-defined or engineered temperature gradient field.

For example, for a film disposed on a surface in which the engineered temperature gradient field is defined by the topology of a top surface, the system can be described by an array of protrusions labeled by index j of lateral extent $l_o$, and depth given by $D(X,Y) = D_o - \Delta D_j F(X,Y)$ where $F(X,Y) = \{1 - \tan h[C(2\xi/l_o - 1)]\}/2$; where the parameter C controls the side-wall slope of a protruding element.

For example, a single extended ridge would be described by the equation, $\xi = |X|$. Alternatively, a square array of four cylindrical protrusions, $\xi = [(X - X_{o,j})^2 + (Y - Y_{o,j})^2]^{1/2}$, where $(X_{o,j}, Y_{o,j})$ denotes the cylinder midpoint viewed from above.

It should be noted that that Eq. 2 describes the formation of liquefied surface features, and is therefore valid up until the moment these features contact a protruding element or the top surface. Accordingly, the predictive properties of Eq. (2) as shown require that the PTL growth apparatus and method be operated in a non-contact mode. After such contact, subsequent spreading and/or solidification of the liquefied film can occur, which requires additional specification of the dynamics of moving contact lines. Such specification is well known to those of ordinary skill in the art and can therefore be easily included in the equations describing the formation of structures before and after contact.

It should also be understood that the above equations assume that the viscosity of the liquefied film is a constant throughout the growth of the structure. This approximation remains valid for structures whose ultimate vertical scale lies within nanoscale dimensions. The analytic expression describing the separation distance between evolving structures also does not depend on the variation of viscosity with temperature. Under different manifestations, or for different applications, the thermal variation in viscosity with temperature may play a role, with the ultimate effect that the viscosity of cooler regions of the liquefied film will be slightly higher than the viscosity of warmer regions. Although this thermal dependence has little effect on the actual size, shape and critical dimensions of the 2D and 3D structures formed during growth, it may have a more substantial effect on the time required to fabricate structures with high aspect ratios. Accordingly, one of ordinary skill in the art will understand that the method of the current invention (as embodied by Eqs. 2 and 3 above) can, in one preferred embodiment, be modified to take into account the known variability of the viscosity of the liquefied film material with temperature.

Finite element simulations of the evolution equation to determine the growth of molten shapes presented in the Exemplary Embodiments, below, illustrate how the engineered temperature gradients formed in accordance with the current method for the case of unpatterned or patterned target substrate can be used to fabricate features of different heights and separation distances in a single process step, while controlling for proximity effects during the evolution of adjacent structures. As will be described in the Exemplary Embodiments, analytic predictions of that model for the dominant structure height and spacings $\lambda_{dom}$, as a function of $h_o$, $d_o$ and relevant material parameters show good agreement with actual values of the pillar spacing as measured by Schäffer et al. (cited above).

Comparison of Inventive TL Growth Modeling Versus Conventional Acoustic Photon Theory As previously discussed, experiments by several groups during the past decade have shown that a molten polymer nanofilm subject to a large transverse thermal gradient undergoes spontaneous formation of periodic nanopillar arrays. The prevailing explanation is that coherent reflections of acoustic phonons within the film cause a periodic modulation of the radiation pressure, which enhances surface feature growth. We shall refer to this model as the acoustic phonon or "AP" model. The current invention demonstrates that thermocapillary forces play a crucial and dominant role in the formation process. As described above, the model in accordance with the current invention is referenced as the thermocapillary model or "TC" model. To demonstrate that the modeling method of the current invention better and more completely describes the growth of surface features, analytic and numerical predictions based on the inventive modeling method have been run on the data obtained in experiments previously explained through the acoustic photon theory. In the discussion that follows, it will be shown that modeling results from the inventive theory provide excellent agreement with the pillar spacings obtained in the prior art studies.

The prior art study used an experimental setup as shown in FIG. 1. In the experiments under study, molten polymer films were subjected to a vertical thermal gradient overnight after which the temperatures of both substrates were brought to room temperature to solidify the structures formed. The opposing wafer was then removed and optical microscopy or atomic force microscope (AFM) images obtained, which revealed the patterns shown in FIG. 2.

As discussed in greater detail above, the kinematic boundary condition describing the evolution of the (dimensionless) gas/liquid interface, namely $dH/d\tau = W(z=H)$ where W represents the vertical component of the liquid velocity, can be re-expressed by the 4th-order, non-linear equation for the evolution of the air/polymer interface as set forth in Eq. 2, above. In the supporting simulations presented, $u_c$ was set by the choice that the film surface slope and thermocapillary stress, respectively, be order one—namely $\nabla_{\parallel} H = 1$ and $(\partial U/\partial Z)_{Z=H} = 1$, such that $u_c = (4\pi)^2 \gamma \epsilon^3 / 3\eta$. This choice is a matter of convenience since it only establishes the "inspection time interval" at which the evolving shapes are viewed; other choices are possible depending on whether the operator of the device wishes to view the formations at shorter or longer time intervals. With this choice and for the experimental parameters corresponding to the experiments of Schaffer et al, the capillary number is $\underline{Ca} = (4\pi)^2/3$ and the Marangoni number is $\underline{Ma} = 3\gamma_\tau \Delta T/[(4\pi)^2 \gamma \epsilon^2] = [D+(\kappa-1)]^2/(\kappa D) \sim O(10^{-1}-10^1)$. For the parameter values pertinent to experiment, spatial gradients in H for times $\tau \leq 1$ are therefore of order one; consequently, the first term in Eq. 2 is of order one, the second term is of order 1-10, and the third term is of order 0.01. The destabilizing thermocapillary term is therefore approximately 100-1000 larger than the stabilizing capillary term, which is the reason why pillar-like 3D elongations can form in this system.

A derivation similar to that leading to Eq. 2 yields the corresponding equation for the acoustic phonon (AP) model (See, e.g., European Patent Publication No. 1339550 B1, cited above), and leads to the following equation:

$$\frac{\partial H}{\partial \tau} + \nabla_{\parallel} \cdot \left( \frac{\overline{Q}(1-\kappa)H^3}{3\overline{Ca}[D+(\kappa-1)H]^2} \nabla_{\parallel} H + \frac{H^3}{3\overline{Ca}} \nabla_{\parallel}^3 H \right) = 0 \qquad \text{Eq. 4}$$

where, $\overline{Q} = 2Qk_a \Delta T/(u_{p\gamma\epsilon}^2)$ is a phenomenological reflectivity coefficient, $u_p$ denotes the speed of sound in polymer, and $\epsilon = h_o/\lambda_{dom}^{AP}$. In this prior art description of the growth process, the liquid flux in Eq. 2, which the current invention describes as being due to shear induced flow by thermocapillary forces (i.e. flow caused by forces which lie parallel to the evolving interface), is instead replaced in Eq. 4 by a pressure driven flow due to acoustic phonon reflections from the various film interfaces (i.e. flow caused by forces which lie perpendicular to the evolving interface).

As described above, conventional linear stability analysis yields the dimensional wavelength for the dominant mode corresponding to the AP model, namely, $$\lambda_{dom}^{AP} = 2\pi h_0 \sqrt{\frac{\gamma u_p}{Q(1-\kappa)k_a \Delta T}} \left[\frac{d}{h_0} + \kappa - 1\right]. \qquad \text{Eq. 5}$$

This AP prediction stands in contrast to the prediction of the TC model given by Eq. (3).

Figure 5:
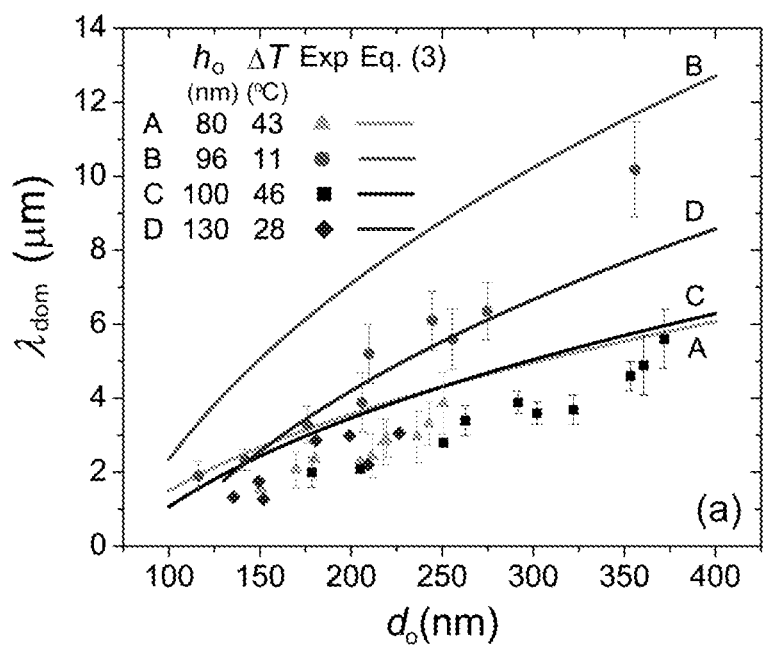
FIG. 5 provides experimental data from (A) literature, and (B) fitting coefficients are of the form [experiments A-D, $C_1$ ($10^3$ μm)$^{0.5}$, $C_2$ (0.1 μm)$^{1.5}$]: [A, 0.353, −34.7], [B, 0.650, −64.6], [C, 0.379, −46.0], [D, 0.340, −30.7], and for the AP model, Q=6.2 and $u_p$=1850 m/s.
Figure 5:
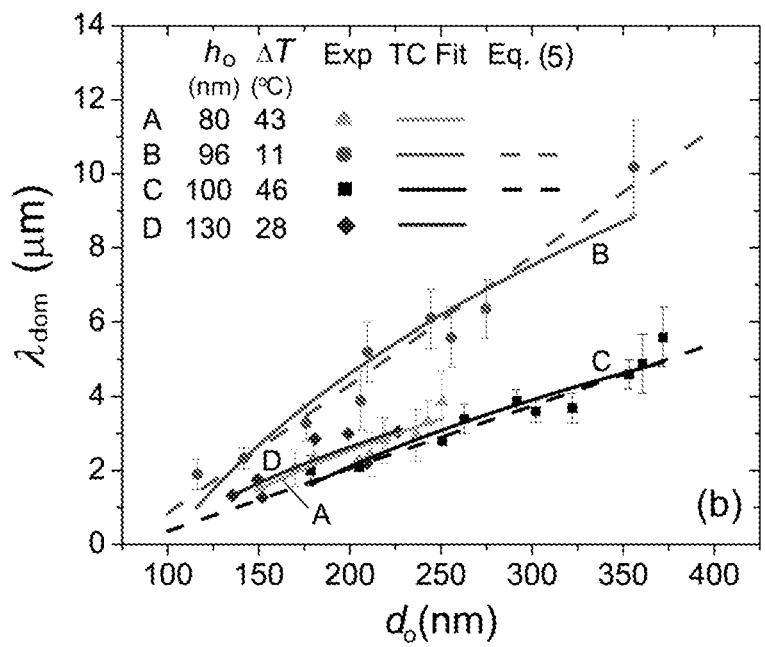

These contrasting length scales can be directly compared to the pillar spacings observed in the experimental data provided in the prior art. The linear stability analysis conducted for the TC model also yields the dimensionless cutoff wave number $K_c$ below which all modes are unstable and undergo growth and above which all modes are stable and undergo no growth. For the inventive (TC) model, $K_c^{TC} = (3/2 \overline{MaCa}\kappa D)^{1/2}/[D+(\kappa-1)]$. Solutions of Eq. 3 shown in FIG. 5a contain no adjustable parameters. While the functional dependence of Eq. 3 on $d_o$ is in good agreement with experiment, the inventive model systematically over predicts the average pillar spacing, in some cases by as much as 10-25%. To further test the dependence of $\lambda_{dom}^{TC}$ on $d_o$, a least-squares fit was performed on the experimental data to the form of Eq. 3, namely $C_1 d_o^{1/2} + C_2 d_o^{-1/2}$, as shown in FIG. 5$b$. Superimposed on these curves is also a least-squares fit to Eq. 5 with fitting parameters Q=6.2 and $u_\rho$=1850 m/s. (See, E. Schäffer, et al., Macromolecules 36, 1645 (2003), cited above.) The agreement with the TC model is excellent.

Analysis of the experimental data has also determined that several experimental factors contribute to the offset observed in FIG. 5$a$, and that once these factors are accounted for, the TC model correctly predicts all relevant growth parameters, including pillar spacing. Specifically, one key issue involves the measured values of $h_o$ reported by other researchers in the literature. Spin cast polymer films are prone to significant solvent retention, which is typically eliminated by baking and annealing films for several hours in a vacuum oven at elevated temperatures to draw out all solvent from the film and to smooth over any undesirable nonuniformities or pinholes which result from solvent evaporation. (See, e.g., J. Garcia-Turiel and B. Jérôme, Colloid Polyp. Sci., 285, 1617 (2007); and J. Perlich, et al., *Macromolecules*, 42, 337 (2009), the disclosures of each of which are incorporated herein by reference.) Significant shrinkage in film thickness of up to 50% has been reported based on ambient vapor pressure, time and temperature of the bake and annealing steps.

Figure 6:
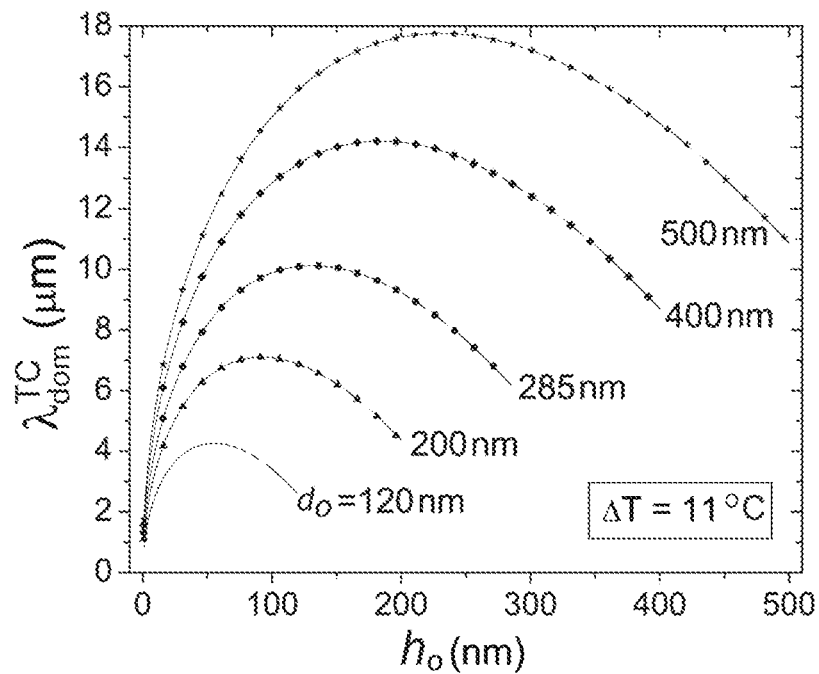
FIG. 6 provide data graphs of solutions of Eq. 3 for ΔT=11° C. and 46° C.
Figure 6:
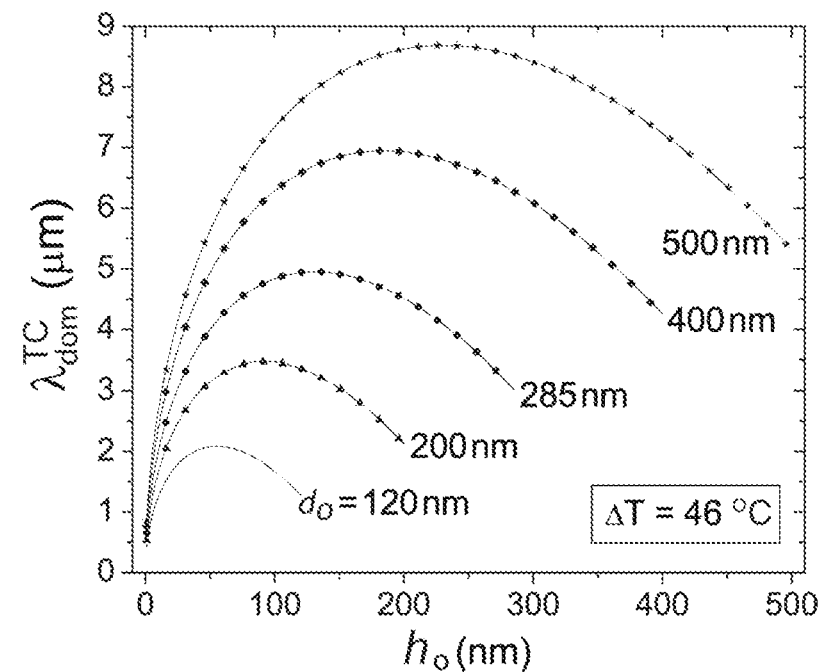

In all published reports of the experiments under analysis of, there are no reports of film annealing or baking following spin casting. The elimination of this step after spin coating, which is known to those skilled in the art, leads to artificially swollen films and therefore overestimates of the film thickness $h_o$ since the polymer films still contain solvent. Since the value of $h_o$ is required for predictions of the spacing, growth rate and shapes of structures obtained, it is important that these input values be accurately known. (See, e.g., E. Schäffer, PhD Thesis, Univ. of Konstanz, Germany (2001); E. Schäffer, et al., Adv. Mater. 15(6), 514 (2003); E. Schäffer, et al., Europhys. Lett., 60(2), 255 (2002); E. Schäffer, et al., Macromolecules 36, 1645 (2003); and J. Peng, et al., Polymer 45, 8013 (2004), cited above.) Indeed, FIG. 6 demonstrates the strong dependence of $\lambda_{dom}^{TC}$ on $h_o$ and $d_o$ and the steep drop in the predicted value of $\lambda_{dom}^{TC}$ that occurs for small values of $\Delta T$ and small values of $h_o$. Smaller values of $h_o$ due to film shrinkage therefore lead to even better agreement between the measured and predicted values of the nanopillar spacings observed in experiments using two unpatterned parallel substrates subject to a vertical temperature gradient. When films are properly handled and annealed after spin coating, all solvent evaporation effects will have occurred prior to insertion of the film in the experimental assembly and will therefore play no role in pillar formation. Those skilled in the art can easily include solvent evaporation effects into Eq. (2) if so needed.

Figure 7:
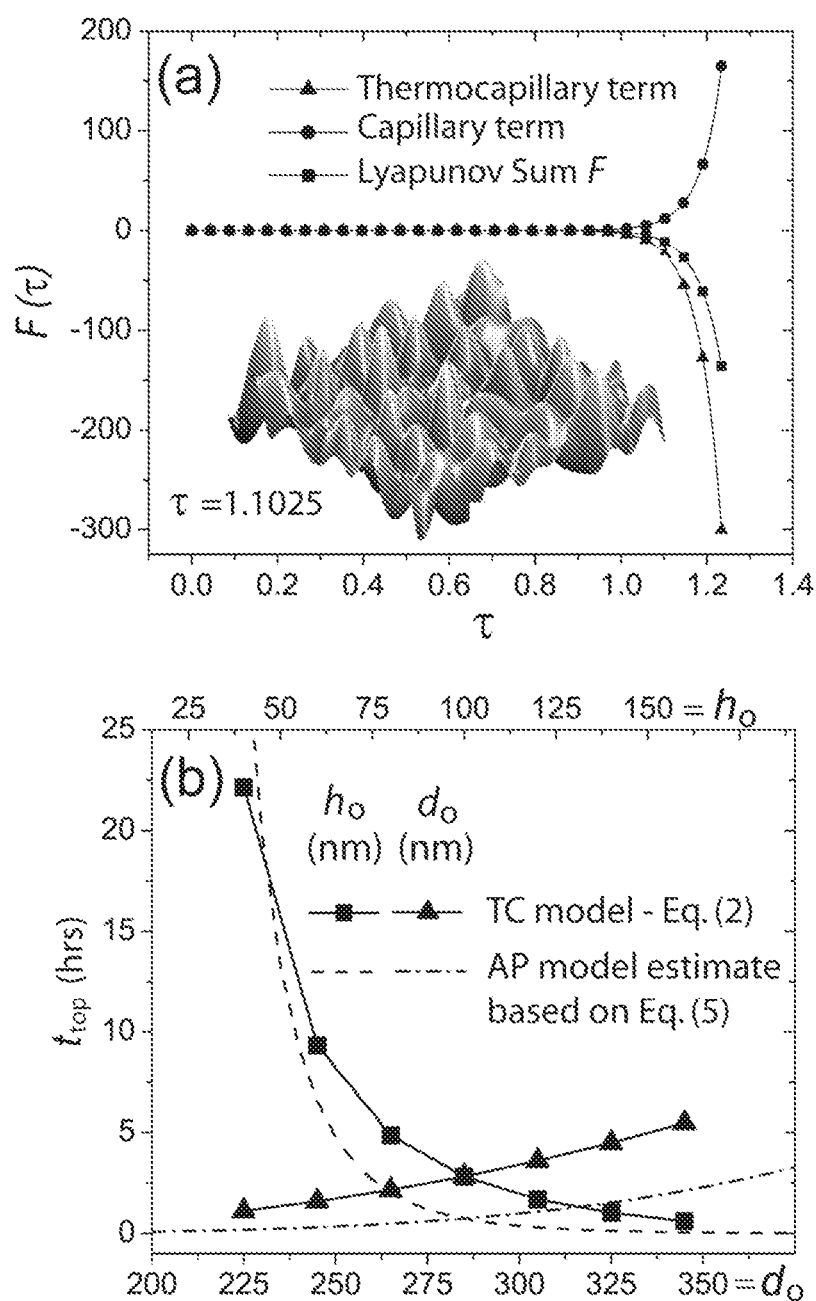
FIG. 7 provides data graphs for (A) the evolution of the Lyapunov free energy for the case $h_o$=100 nm, $d_o$=285 nm, ΔT=46° C., time t=2.28τ hours, (inset) plots H(X, Y,τ=1.1025) from finite element simulations of Eq. 2, and (B) time required, $t_{top}$, for fastest growing pillars to contact upper surface for parameter values given in (A) where for variation with $h_o$, $d_o$=285 nm and for variation with $d_o$, $h_o$=100 nm.

In order to prove that the thermocapillary instability is unsaturable (i.e. that elongations will always continue to grow toward the opposing substrate unless limited by available mass), one skilled in the art can construct the so-called Lyapunov free energy, $=\int \zeta \partial x \partial y$, for the evolving film where:

$$\zeta = (\nabla_\| H)^2 - \frac{3\kappa \overline{MaCa}}{D}\left[H\ln\left(\frac{H}{1+\chi H}\right) + \ln(1+\chi)\right] \quad \text{Eq. 6}$$

and =($\kappa$−1)/D. (See, A. Oron and P. Roseau, J. Phys. II (France) 2,131 (1992); and A. Oron, Phys. Fluids, 12, 1633 (2000), the disclosures of which are incorporated herein by reference.) This expression describes the total energy of the liquefied film as a function of time and can be used to determine which mechanism is energetically favorable (2$^{nd}$ term on the right hand side, which represents thermocapillary forces) and which disfavorable (first term on right hand side, which represents the forces of surface tension) during the process of structure formation. Finite element simulations with periodic boundary conditions and 2nd order Lagrangian shape functions for spatial discretization of the film height were conducted for an assembly as shown in FIG. 1. According to FIG. 7$a$, when the dimensionless time t is approximately less than or equal to one, the total energy of the system remains constant and the two opposing mechanisms are in balance. During this period, very small aperiodic or periodic structures appear on an initially flat liquefied film. Once $\tau$ exceeds unity, film evolution enters the nonlinear regime and structures begin to grow exponentially fast, as indicated by the steep drop in the total system energy (i.e. the total sum F) due to the overwhelming influence of thermocapillary forces. The terminating points for each curve correspond to the time when the fastest growing protrusion makes contact with the upper plate. These results clearly show that so long as there is mass which can be transferred from an existing film to the elongations which form, a liquefied film will undergo growth of 3D structures in the direction defined by the vertical thermal gradient.

The thermocapillary instability is non-saturating (i.e. no steady state solution in contrast to Rayleigh-Bénard or Bénard-Marangoni instabilities); elongations continue to grow until they make contact with the upper plate or until they solidify in place if the temperature of the opposing substrate lies below the solidification temperature of the evolving structure. Shown in FIG. 7$b$ are predictions of the time required for the fastest growing elongations to make contact with the opposing plate. The TC curve was obtained from Eq. 2; the AP curve is an estimate based on the growth rate corresponding to Eq. 5 from linear stability analysis. The estimates in FIG. 7$b$ also indicate that the fastest growing protrusions contact the upper substrate within a few hours of formation, while the experiments conducted by Schäffer et al lasted overnight. In those experiments, it is suspected that filaments formed which bridged both substrates since the temperatures of the upper and lower substrates were maintained at values above the polymer solidification temperature. Such filamental structures are known to undergo lateral capillary and/or thermocapillary migration toward narrower gaps representative of the slight wedge geometry actually used in those experiments (i.e. Schaeffer at al reported a relative tilt between the top and bottom substrates of approximately 1 µm per cm). When such a relative tilt is incorporated into the TC model, it is found to lead to even better agreement between the inventive method and experimental measurements. The inventive method has also been used to investigate much larger values of D=$d_o/h_o$, for which it is found that nanopillar arrays oriented in a hexagonal pattern is obtained, in contrast to the case of relative tilt (described above) which leads to formation of nanopillar arrays of increasing height oriented in a square pattern.

In summary, this comparison provides evidence that thermocapillary stresses, not an acoustic phonon phenomenon as previously thought, play a crucial and dominant role in the formation of pillar arrays in molten nanofilms subject to a large transverse thermal gradient. The parameter range explored by Schaeffer et al experimentally corresponds to an unexplored limit of a new deformational instability in which destabilizing thermocapillary forces far outweigh stabilization by capillary or gravitational forces. The predominance of thermocapillary effects allows the formation of elongated nanostructures. The above analysis also indicates that any liquefiable thin film, not just polymer films, which are subject to any value of thermal gradient no matter how small, will undergo formation of elongations. The analysis also indicates that high resolution optical or other technologically useful large area arrays with very small feature sizes may be fabricated by the use of very large thermal gradients, smaller gap widths, and smaller initial film thicknesses $h_o$. This understanding applies to initial films of any configuration, not just initial flat films, and substrates that can be patterned or curved, including substrates which may exhibit unintended or controlled inhomogeneities in thermal conductivity. Liquefied formations can also form in the absence of an opposing substrate so long as the operator provides a means of imposing variations in the interfacial temperature of the liquefied film to be patterned, as indicated in FIG. 8B. The medium in between the opposing plate and the film to be patterned need not be air but can represent a gas or other fluid or soft solid, including miscible or immiscible material. The film to be patterned can consist of a single component liquid or other liquid consisting of another liquid or droplets, inclusions, suspensions, liquid crystals, or other embedded material.

Discussion of Embodiments of the PTL Apparatus and Method

Figure 8A:
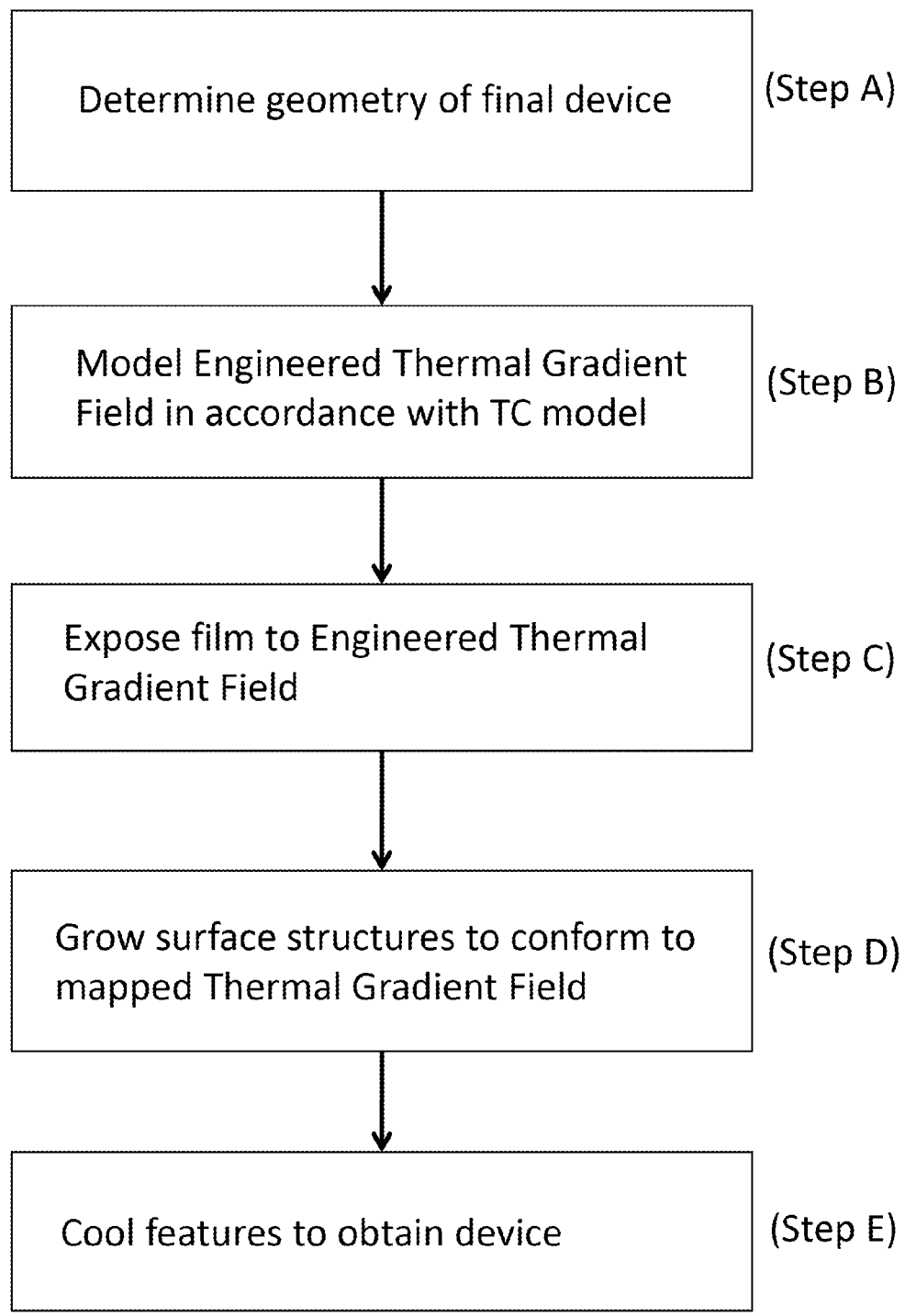
FIG. 8A provides a schematic flow chart of an embodiment of the patterned thermocapillary lithography process in accordance with the current invention.
Figure 8:
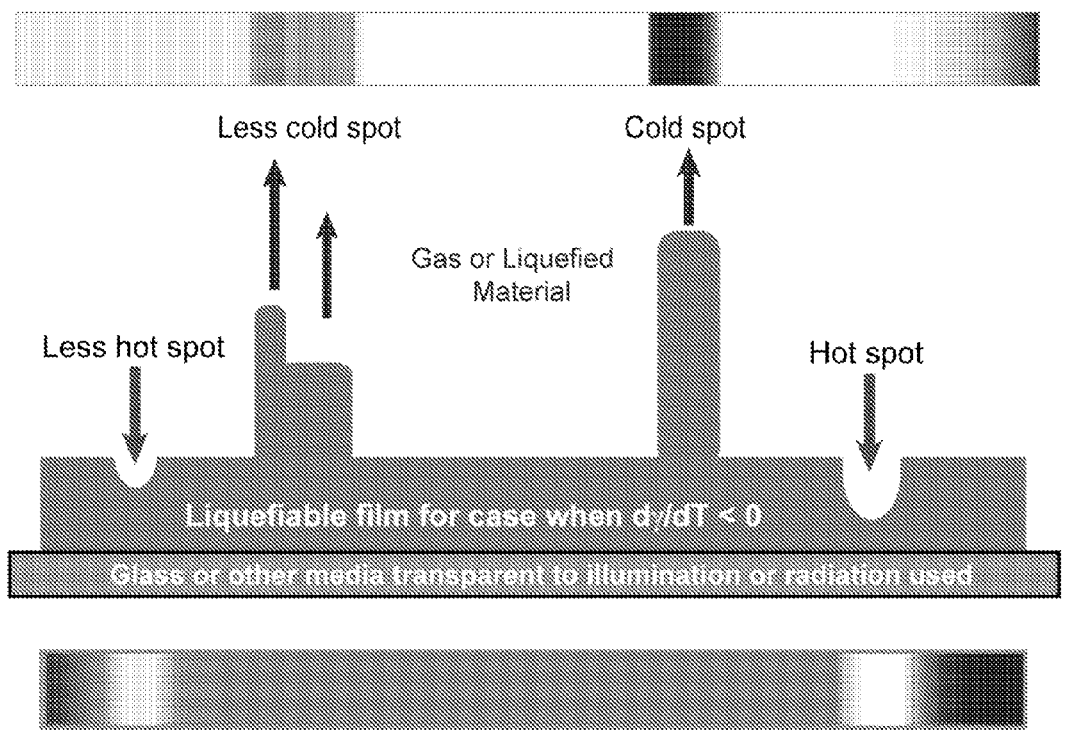
FIG. 8B is a schematic diagram of a third thermocapillary lithography device that could be used in accordance with the present invention, where the engineering temperature gradients are enforced remotely on the liquefiable film from thermal variations imposed above and/or below by modulated illumination or radiation intensity by laser or other heating/cooling methods, i.e. without the use of topologically modified substrates.

The Patterned Thermocapillary Lithography apparatus of the current invention may comprise many of the same features of a conventional TL apparatus. Specifically, either of the TL devices, shown in FIGS. 1 and 3, applied to molten polymers as taught in the prior art, could, in theory, be used to fabricate structures using the inventive PTL process. However, it should be understood that the current method allows for the application of the TL growth method under a much broader set of growth conditions including that depicted in FIG. 8B. For example, using the method and apparatus of the current invention, there is no minimum temperature gradient necessary; moreover, the film itself can be formed of any liquefiable material as there is no minimum thermal conductivity, viscosity, etc. required. Finally, although the previous discussion has focused on TL apparatuses in which the temperature gradient is applied by placing two surfaces in very close proximity, in the current invention the only requirement is that the film interface be exposed to a temperature gradient field engineered in accordance with the PTL modeling process, described above. Specifically, as shown in FIG. 8A, in accordance with the current invention:

The geometry of the final device would first be determined (Step A);

An engineered thermal gradient field to be used in fabricating the device would then be determined using the inventive TC model (Step B), in which a novel interface evolution equation, models the growth rate and profile for a structure based on:

interfacial temperature variations, which generate tangential shear stresses, which in turn promote the growth of pillars toward the direction of the local maxima in thermal gradient; and capillary forces, which are based on the underlying physical properties of the materials being use, and which repress formation of additional surface area.

The film would then be introduced onto a substrate on which the engineered thermal gradient field may be applied and the surface features allowed to grow to their final shape (Step C);

The engineered thermal gradient field would then be applied to one or more interfaces comprising the film, e.g., in the form of topographic features and/or spatially varying surface energy and/or spatially varying thermal conductivity and/or spatially varying temperature profile (Step D); and The temperature gradient would be removed and the fabricated features allowed to solidify to affix the final shape (Step E).

Although the above discussion has focused on the broad outline of the apparatus and method of patterning with only a few embodiments, it should be understood that the technique is generally applicable to a number of different kinds of films, substrates, temperature gradient application means, mediums, etc. In addition, the pattern growth induced by the PTL process may be controlled by adjusting any of the parameters of the system, such as, for example, the material properties of the film or media, the nature of the substrate, the application of the temperature gradient, etc. A non-exclusive discussion of some exemplary alternative embodiments are discussed below.

For example, although a simple thin film of liquefied material is assumed in the above example, for the purposes of the current invention the film to be patterned can be of a single layer or can include a plurality of layers, i.e. two or more. In the case where a second film is provided adjacent to the base film, layer or interface to be patterned, the contact surface of the two films, i.e. the interface of the two adjacent films, would be patterned and, preferably, the texture would be generated in a liquid-liquid interface. In such an embodiment, completion of the patterning process, the second film or layer can be removed if desired by a conventional technique, such as by application of a chemical solvent, etc.

In addition, the film layers can be any liquefiable material, including materials that are in a solid, liquid or gaseous state. Specifically, it must be stressed, again, that the method and apparatus proves that the TL effect is not limited to molten polymer films, but will be operational in any liquefiable thin film, no matter what its constitution, including simple or complex liquids, liquids containing embedded particles, inclusions or droplets, binary or tertiary liquid compounds, liquids containing thermoactive material, suspensions, liquid crystals, or other micro- or nanostructured material and so on.

The flow of liquid from warmer to cooler regions of the interface occurs in liquid films whose surface tension increases with decreasing temperature. There exist other types of liquid like molten borosilicate glasses, etc whose surface tension decreases with decreasing temperature. These will exhibit the opposite flow i.e. the liquefied film will flow from cooler toward warmer regions of the film interface. These too will form microscale and nanoscale pillars provided the location of the hot and cold substrates shown in FIGS. 1 and 2 are switched or more generally, that the applied thermal gradient is reversed. With normal liquids that flow from warm to cool regions, reversal of the thermal gradient will produce controlled formation of holes in the film instead of elongations, also useful for technological applications.

In a preferred embodiment, the thermally conducting material that is used in the process, must contain at least one film to be patterned, which is an organic polymer or oligomer.

It should be understood that the molecular weight of the organic polymer or oligomer used is not subject to any particular limitation. As preferred examples of the organic polymer usable in course of the process according to the present invention, polystyrene, partially or fully chlorinated or brominates polystyrene, polyacrylates and polymethyl-methacrylates can be exemplified.

Although any film thickness that allows for the growth of 2D and 3D structures via the TL process may be used, preferably the film thickness is within the range of 10 nm to 10,000 nm, and more preferably 0 nm to 1000 nm.

Regardless of the form the film takes, the deposition of the single or multilayer film can be carried out by any suitable conventionally known technique, such as, for example, spin coating, dip coating, blade coating, meniscus coating, spraying, immersion coating and so on.

As discussed above, although the film can take the form of a liquid, solid or gas, preferably the film is in liquid form after deposition onto the substrate surface. Alternatively, the film can be liquefied before and/or during exposition to a temperature gradient. In such an embodiment, the liquefaction can be performed by any suitable technique, such as by heating or treating with a solvent or in a solvent atmosphere. For example, when the film is a glassy or semi-crystalline polymer, it may be solid at room temperature and turn liquid upon heating. In turn, after the pattern growth is complete the film can be solidified, such as, for example, by cooling, chemical reaction, cross-linking, polymerization reaction, a sol-gel process and so on.

Turning to construction of the apparatus itself, the substrate, and, in those embodiments of the apparatus in which a second proximal plate (such as a top plate) is used to apply the temperature gradient to the film, the top plate, can each include a single layer or a plurality of layers. Regardless of the number and location of these surfaces, any of these such surfaces can be formed of a solid or liquid material. In one preferred embodiment, the surfaces are formed from semiconductor wafers, such as a silicon wafer. In another embodiment, they can be formed from glass or fused quartz substrates, with or without metallic coatings like indium tin oxide which can be used for heating the substrates. It should be understood that any such surface may be modified, such as, by coating, either for heating or cooling the substrate or for chemically modifying the substrate.

The temperature gradient can, likewise be applied to the film by any technique suitable for providing sufficient thermal resolution to the system. These techniques may take the form of conventional two proximal surface methods, such as those described in the prior art, or by single surface methods, such as, for example, by exposing the surface to variable heating or cooling via laser light, black body or other type of conductive, convective or radiative illumination, as shown in FIG. 8B.

In an embodiment of the invention where multiple proximal surfaces are used to apply the thermal gradient, any such surface can take any form suitable for the desired device growth. For example, the substrate and top plate may be either planar or non-planar, patterned or unpatterned, so long as an engineered thermal gradient field is incorporated into one or both of the substrate or top plate. In one embodiment, at least one of the substrate surface and/or the top surface is patterned with topographic features and/or has a spatially varying surface energy and/or a spatially varying thermal conductivity and/or a spatially varying temperature profile (such as by differential or spot heating or cooling). When patterned, the substrate and top plates may be formed, for example, with a plurality of depressions and projections or some other topographic features. Thus, the topographic features formed in the surfaces can result in varying distances between the substrate surface and the mounting surface, which can in turn yield laterally varying temperature gradients between the two opposing surface. In addition, more than one mounting surface or top plate can be provided to generate spatially complex temperature gradients. Moreover, the surfaces do not need to be disposed parallel to one another. Regardless of the form of substrates inhomogeneities, any such variation, will, in turn, lead to the application of variable surface stresses along the film interface resulting in the growth of 2D and 3D surface features. How to model a pattern capable of producing a desired final structure is the subject matter of this invention, and will be discussed in greater detail in the section that follows. In such a multiple surface embodiment, the spacing between the substrate surface and the mounting surface is preferably within the range of 10 nm to 10,000 nm, more preferably 50 nm to 1000 nm, even more preferably 150 nm to 600 nm.

Although static surfaces are assumed in the above discussion, it should be understood that the substrate and/or top surfaces may be moved relatively to each other during at least a time fraction of the process time. Specifically, the substrate and/or top surfaces can be moved during the shaping (patterning), cooling and/or post-roll stages of the process. Preferably, the substrate surface and/or mounting surface are moved relatively to each other during a fraction of time the film is exposed to the temperature gradient and the material of the film (e.g., the polymer) is liquefied. For example, by moving the top surface away from the substrate during growth, it is possible to have an aspect ratio of the patterned film that is significantly greater than that of the patterned plate. Alternatively, moving the surfaces laterally with respect to one another could allow for the formation of features that are not strictly perpendicular to the plane of the substrate, for example, angular textures relative to the substrate surface, which can be important for specific device applications.

Any temperature control means suitable for generating a temperature gradient at the film may be used with the current invention. For example, the temperature control means can take the form of temperature baths, heating devices or cooling devices or other conventional temperature devices known in the art. Alternatively, at least one of the substrate surface and/or the mounting surface can be exposed to illumination by conductive, convective or radiative means from a heating source, such as, for example, a laser, an infrared lamp, or any other intensive radiation source. Local cooling can be provided by cooling baths, thermoelectric cooling, Peltier devices and so on. Any value of temperature gradients can be applied to the film interface (0.1° C./m to $10^{10}$° C./m); the values corresponding to experiments to date have typically fallen within the range of $10^{6}$° C./m to $10^{10}$° C./m.

In turn, the film to be patterned may form an interface with any medium suitable for forming an interface at which growth of the desired surface features is possible. For example, the medium may be air or other gas. Alternatively, the film interface may be formed by any liquid or solid material capable of producing a suitable temperature gradient, and having density/viscosity characteristics suitable to allow for the growth of the desired patterned structures. Specifically, the model provided suggests that the interstitial gas layer can be replaced by another liquid to undergo the same process. In fact, this may provide a technological advantage in that the lower interfacial (i.e. surface) tension between the two liquids will ultimately lead to more rapid fabrication of taller structures with a smaller pillar spacing since the normal stresses due to surface tension are decreased.

It should be understood that the above alternative embodiments are not meant to be exclusive, and that other modifications to the basic apparatus and method that do not render the PTL technique inoperative may be used in conjunction with this invention.

EXEMPLARY EMBODIMENTS

The present invention will now be illustrated by way of the following examples, which are exemplary in nature and are not to be considered to limit the scope of the invention.

Modeling Parameters

The following examples, provide a demonstration of a calculation of the influence of heterogeneous temperature gradient fields in the form of patterned upper wafers on the film shaping process based on the inventive method. Using finite element simulations based on the modeling method set forth in the current invention, possible wave interference effects that arise during the formation of adjacent structures were modeled. These studies provide an estimate of proximity effects common in lithographic procedures. In conventional photolithography, proximity effects are caused by wave interference of light. In PTL methods, proximity effects are caused by wave interference from mass transfer in the liquefied film. A cross-sectional view of the system corresponding to the numerical simulations is shown in FIG. 9. In each example, the cooler top wafer held throughout at temperature $T_1$ is patterned with several protruding elements (labeled by index j) of diameter $l_o$ and depth $d_o$-$d_j$. For the purposes of this example, thermal gradients within the supporting or opposing silicon wafers may be neglected because the thermal conductivity of silicon is three orders of magnitude larger than air or polymer.

For the examples presented except where explicitly noted, the following parameters were held fixed: $h_o$=100 nm, $d_o$=285 nm, $T_2$=170° C. and $T_1$=124° C. The material constants correspond to those of PS quoted in the literature: $\gamma$=0.0315 N/m and $\gamma_T$=0.0885·$10^{-3}$ N/m-° C. (at 180° C.), $\eta$=2.5·$10^5$ Pa·s (at 170° C.) and $\kappa$=0.277 (at 170° C.). (See, e.g., J. C. Moreira and N. R. Demarquette, J. Appl. Polym. Sci. 82, 1907 (2001); J. L. Masson and P. F. Green, Phys. Rev. E 65, 31806 (2002); D. R. Lide, *CRC Handbook of Chem. and Phys.*, $73^{rd}$ ed. (CRC Publ. Co., Boca Raton, Fl., 1992); and J. E. Mark, *Physical Properties of Polymers Handbook* (AIP Press, Woodbury, N.Y., 1996, the disclosures of each of which are incorporated herein by reference.) All remaining variables and material properties are provided below.

Example 1

Finite element simulations (which are described further in COMSOL Multiphysics, V3.4, Comsol, Inc. (Los Angeles, Calif., 2007), the disclosure of which is incorporated herein by reference) based on Eq. 2 were run for two types of wafer topologies to determine the inventive method's accuracy in modeling proximity effects arising from wave interference during pattern evolution. In particular, in these exemplary embodiments, the influence of lateral feature size $l_0$ on the number and shape of peaks formed beneath a protruding element was investigated in order to quantify proximity effects.

Figure 10:
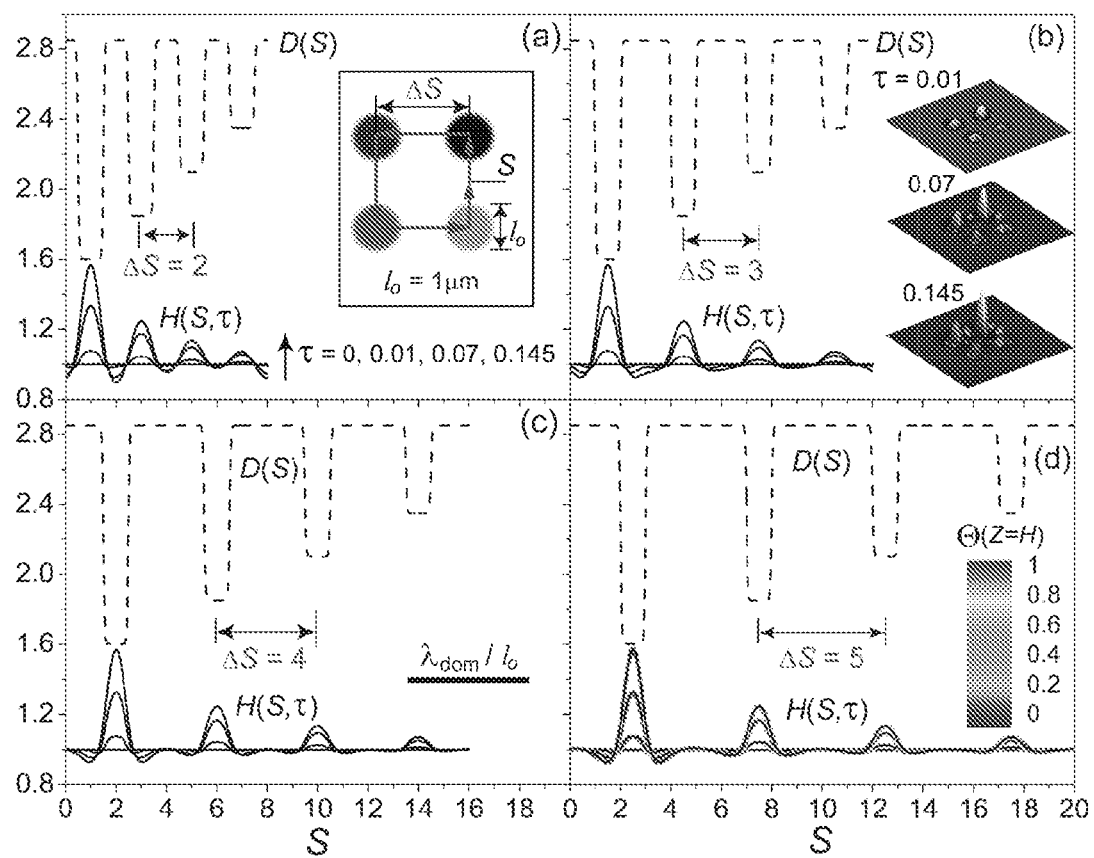
FIG. 10 provides data graphs providing plots of the dimensionless film thickness H(S,t) (i.e. film thickness normalized by $h_o$) as a function of perimeter distance S (measured in counterclockwise fashion) and as a function of the dimensionless time τ=0.0, 0.01, 0.07 and 0.145 for a square array of cylindrical protrusions of diameter $l_o$=1.0 micrometer and decreasing size 1.25, 1.0, 0.75 and 0.5 (in units of $h_o$), separated by an equal distance (a) ΔS=2, (b) ΔS=3, (c) ΔS=4, and (d) ΔS=5.

For the configuration examined in FIG. 10, the top wafer is patterned into a square array of four cylinders of diameter $l_o$=1 micron, which measure in depth $\Delta D_j$ (j=1-4)=1.25, 1.0, 0.75 and 0.50. In this case, $u_c$=2.84 nm/s, $\lambda_{dom}$=4.83 microns, $\overline{\text{Ma}}$=5.73 and $\overline{\text{Ca}}$=2.25. Shown in the figure are cross-sectional views along the perimeter distance S for pillar spacings $\Delta S$=2, 3, 4 and 5 (measured in units of $l_o$) at four dimensionless times $\tau$ ranging from 0 to 0.145; the final time shown corresponds to contact of the polymer melt with the longest protrusion. The inset of FIG. 10b shows 3D images of the evolving film at the prescribed times for a pillar spacing $\Delta S$=3. The metric bar shown in (FIG. 10c) provides a comparison of the spacing $\Delta S$ to the dimensionless wavelength $\lambda$dom o=4.83. The color inset in (FIG. 10d) displays the variation in the normalized polymer surface temperature $\Theta(Z=H)=(T_{z=h}-T_1)/(T_2-T_1)$ at the specified times for a pillar spacing $\Delta S$=5.

These results indicate that the time required to contact the longest protrusion is rather insensitive to $\Delta S$; however, the longest protrusion generates the most significant film deformation, both vertically and horizontally, since the local thermal gradients generated in the film in the vicinity of the protrusion are larger. The material necessary for growth of a pillar must flow from its vicinity, a process that depletes polymer from the surrounding areas to produce the characteristic dips observed on either side of the main pillar.

For the shapes shown in FIGS. 10a to 10d, the lateral extent of film deformation beneath the longest protrusion is approximately $4l_o$. Consequently, neighboring waveforms undergo interference for cylinder spacings less than this value, as observed in FIGS. 10a and 10b. Constructive interference between neighboring perturbations also leads to steeper depressions, as shown in FIG. 10a. The amplitude and lateral extent of these oscillatory sidewaves depends on the time required for the main peak to make contact with the protruding surface; therefore, good temporal control is ultimately required to affix shapes in the film of desired form.

These results illustrate some of the advantages of using engineered substrate preforms to enhance or depress selective regions of a polymer film within a single process run, in contrast to multiple steps normally required with photolithography. These simulations also reveal that for the polymer materials and temperatures of interest, the pillar formation process is surprisingly rapid. For the cases shown, the tallest peak contacts the upper protrusion in less than a minute. This rapid response is due to the fact that the local thermal gradient increases as a peak approaches the upper plate, as depicted by the colored thermal profiles shown in FIG. 10d, which leads to ever faster evolution of the liquid structures.

Example 2

Figure 11:
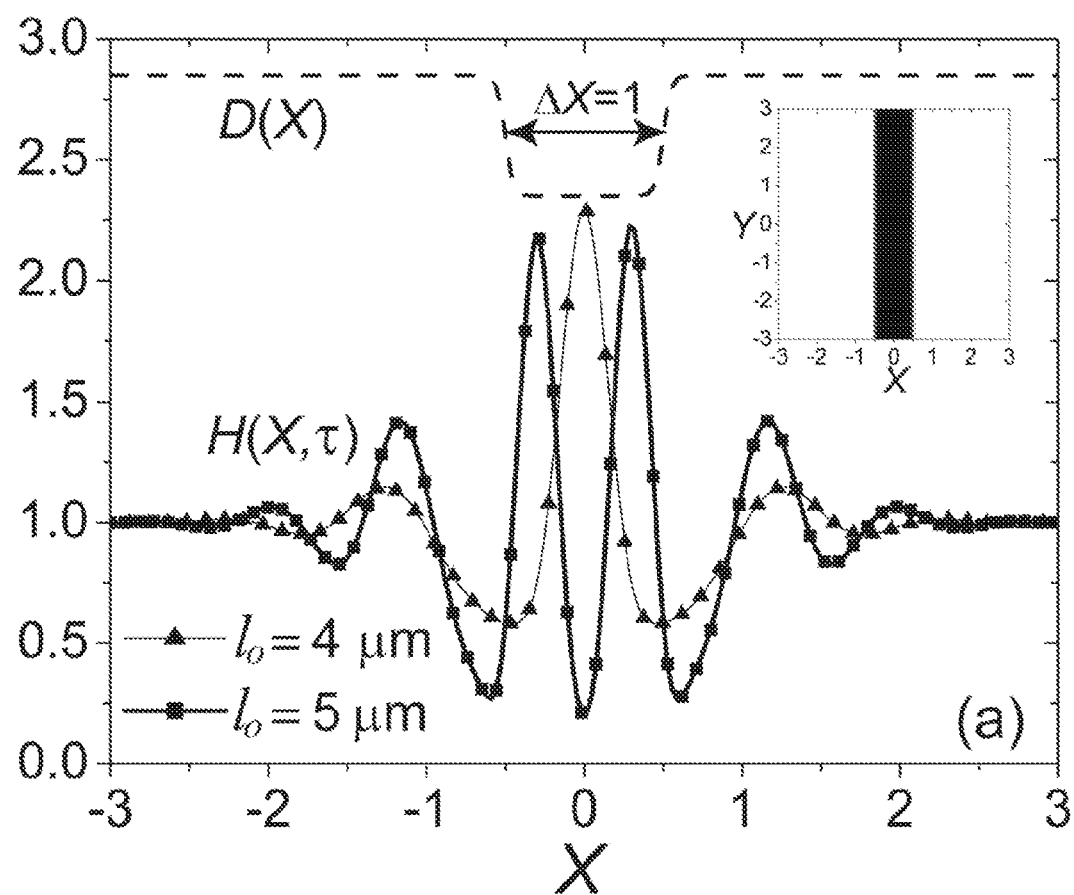
FIG. 11 provides data graphs providing results of film shapes induced by a top wafer patterned with a single extended protrusion resembling a ridge of width 4 or 5 microns, (a) cross-sectional view of film surface along the X-axis, and (b) cross-sectional view of film surface along the Y-axis.
Figure 11:
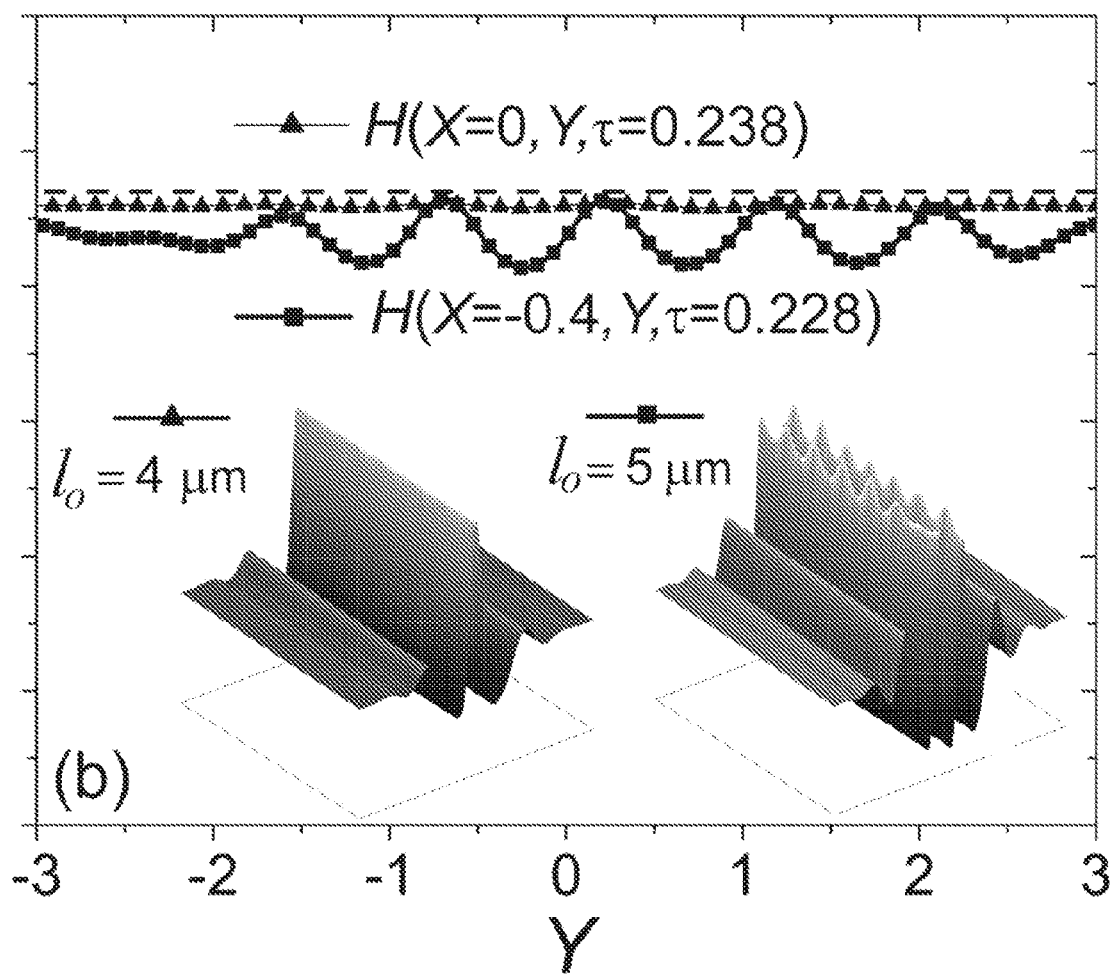

The study shown in FIG. 11 demonstrates more vividly the influence on film shape caused by an imposed feature size either smaller or larger than the dominant length scale $\lambda_{dom}$ discussed previously.

Shown in FIG. 11a is a cross-sectional view of the film shape generated by a single protrusion of depth 50 nm resembling an extended ridge with a width at half-maximum set either to 4 or 5 microns. For comparison, the corresponding characteristic wavelength or length scale for unpatterned wafers is $\lambda_{dom}$=4.83 microns. For the smaller ridge width, the film develops a single peak centered beneath the protrusion. For the larger ridge width, two sharp peaks develop beneath the corners of the ridge. Corresponding 3D images of the film shape are shown in FIG. 11b.

For these runs, $\overline{\text{Ma}}$=5.73 but $\overline{\text{Ca}}$=36.0 for the smaller width ($u_c$=0.71 nm/s) and $\overline{\text{Ca}}$=56.3 for the larger width ($u_c$=0.57 nm/s). Inspection of Eq. 2 reveals that the stabilizing effect of capillary forces is weakened for the wider profile, which enables the formation of two peaks. As also shown in FIG. 11b, the narrow protrusion allows the formation of a central peak with little undulation along the Y-axis within the time period required for the polymer to contact the protrusion. In contrast, the wider protrusion generates an instability along the peak backbone upon approach to the protruding surface. If in Eq. 3 the local gap between the bottom substrate and bottom of the ridge i.e. $d_f$=235 nm is substituted instead of the main gap size $d_o$, then $\lambda_{dom}$=4.07 microns or likewise, $\lambda_{max}/l_o$=0.814, which closely approximates the wavelength observed for the backbone instability. It is also possible that such type of secondary instability may develop in response to the wider ridge width, which exceeds $\lambda_{dom}$. This allows the formation of two spikes of high curvature, which may be subject to a Rayleigh instability as well as thermocapillary instability.

Example 3

Figure 12:
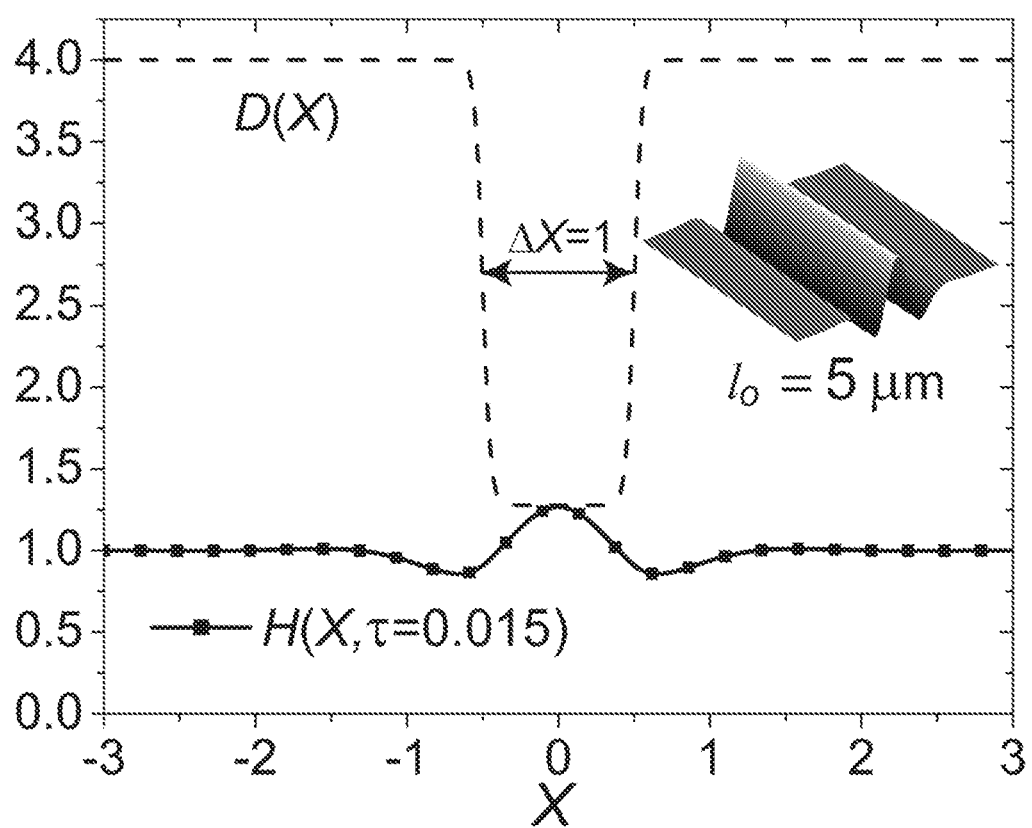
FIG. 12 provides a data graph of dimensionless film shape H(X,t) induced by a ridge placed in close proximity to the polymer surface, where the ridge width $l_o$ is much smaller than the instability wavelength described by Eq. 3 pertinent to a flat wafer with no protrusions.

Using the modeling method of the invention, it has been determined that waveform distortion can be minimized by placing protrusions in close proximity to the surface of the liquefied film. Shown in FIG. 12 is an example of a protrusion similar in shape to the wider ridge in FIG. 11 but for different operating parameters where $h_o$=500 microns and $d_o$=2-microns. The protrusion depth $\Delta d_j$ and width $l_o$ were chosen to be 1.36 μm and 5 μm, respectively. In this case, $l_o \ll \lambda_{dom}$=31.4 μm as given by Eq. 3, where the remaining parameter values are $\overline{Ma}$=9.69, $\overline{Ca}$=1.33 and $u_c$=1.68 nm/s. The lateral feature size induced in the polymer film more closely approximates the imposed pattern width. This finding suggests that the ultimate resolution achievable may require implementation of thermal distributions in close proximity to the polymer surface.

These examples provide proof that the model of the current method is able to accurately predict the growth and evolution of structures made in accordance with a PTL method. In particular, the differences in feature replication observed in Examples 1 to 3 are strongly dependent on the balance between thermocapillary and capillary terms described in Eq. 2. This amplitude ratio is given by:

$$\phi = 3\kappa \overline{MaCa}/[2(D+\kappa-1)^2] \quad \text{Eq. 7}$$

For deformations $\nabla_\| H$ of order 1. For the parameter values in FIG. 10, $\phi$=1.18. In FIG. 11, $\phi$=18.9 for $l_o$=4 microns and $\phi$=29.6 for $l_o$=5 microns. In FIG. 12, $\phi$=0.5. Good pattern replication is therefore achieved for smaller values of $\phi$ and predominance of the term $\nabla_\| D$ in comparison to $\nabla_\| H$. This limit ensures that the imposed thermal gradient is imposed by the engineered thermal gradient fields resulting from the topology of the top wafer and not by subsequent deformations in film thickness.

Example 4

Figure 13A:
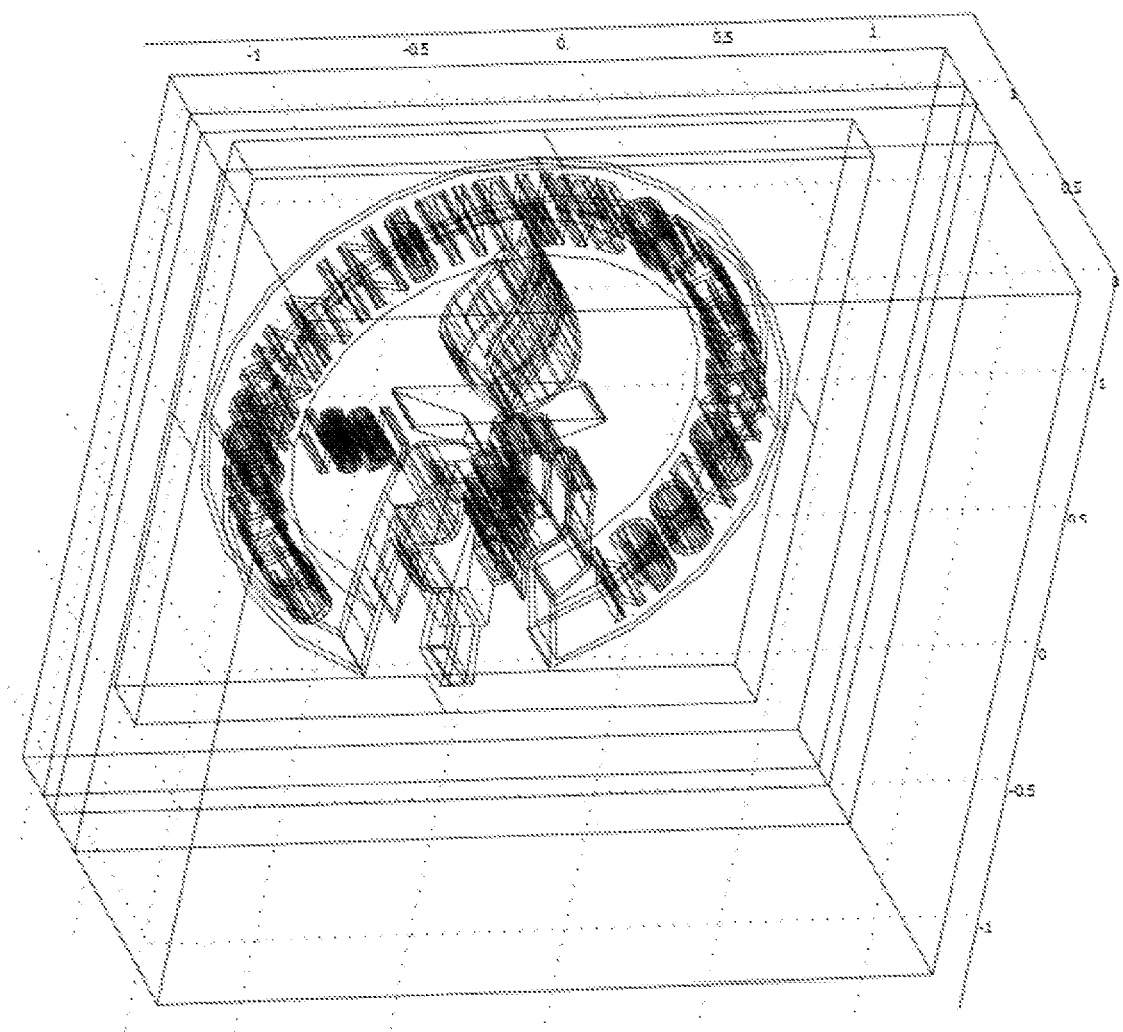
FIG. 13 provides images of an exemplary complex shape made in accordance with the PTL method of the current invention.
Figure 13B:
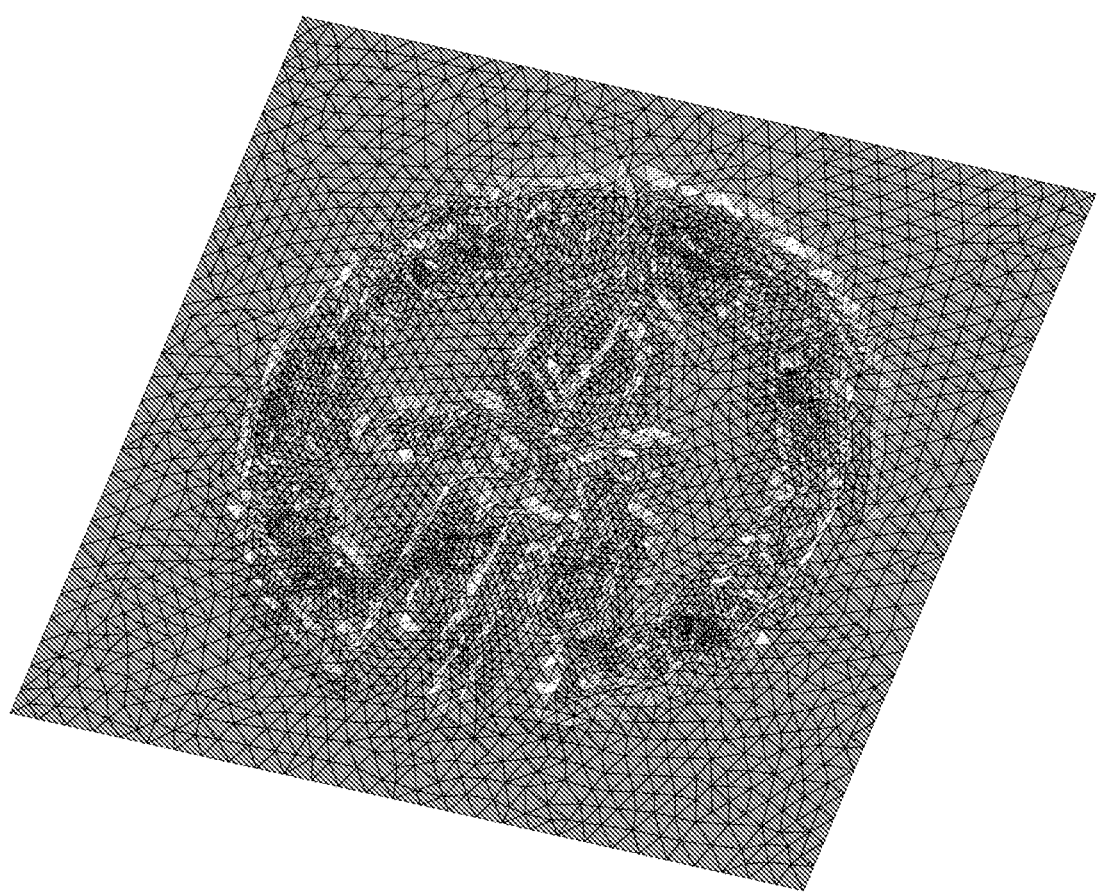
Figure 13:
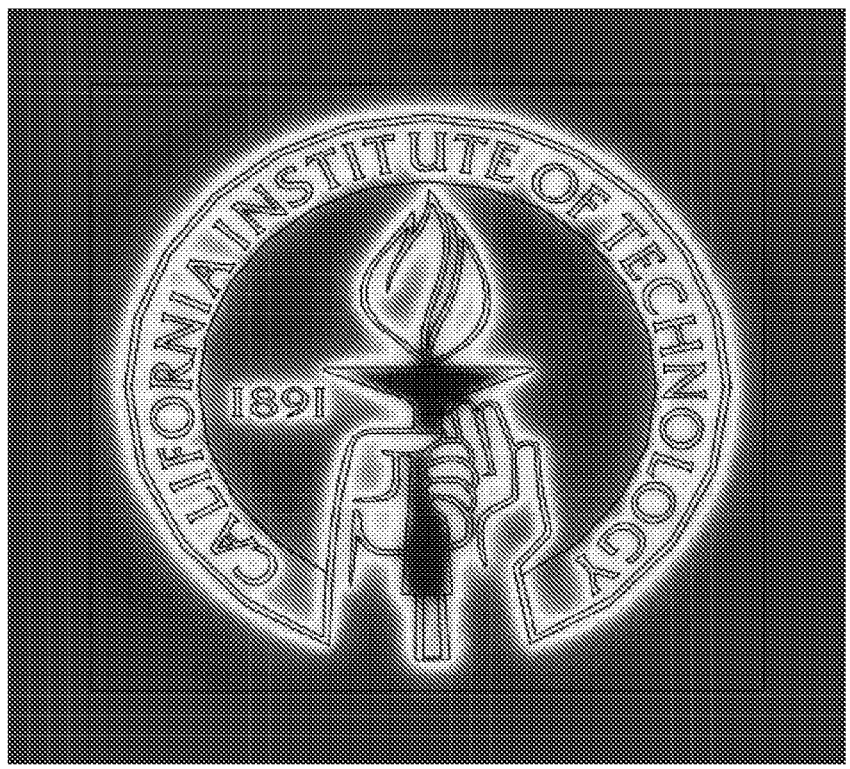
Figure 13:
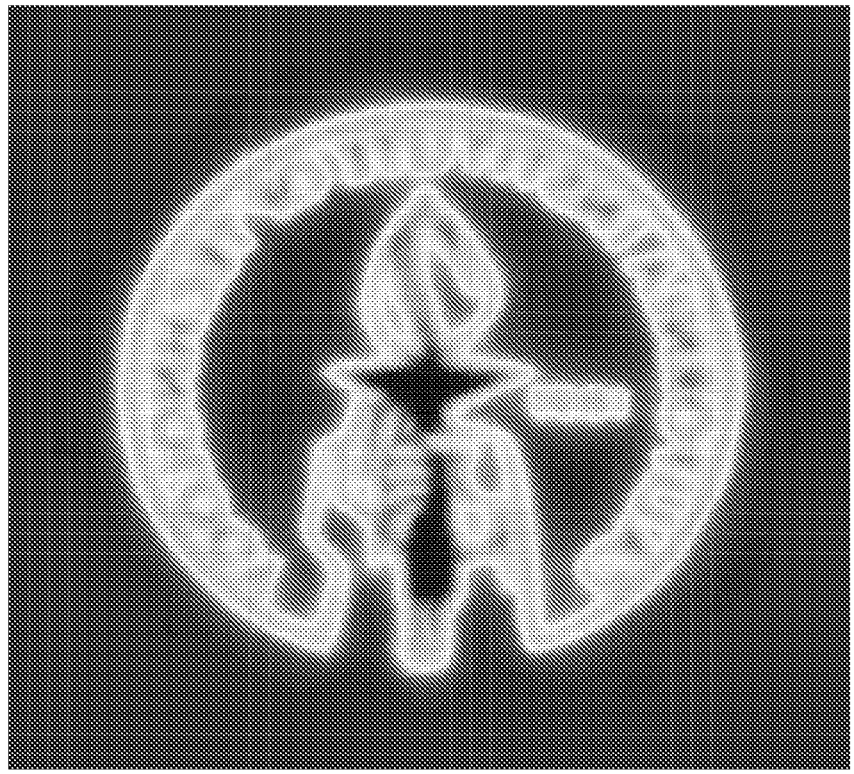

One practical example of the use of PTL for pattern replication is shown in FIG. 13. In this example, commercially available CAD software is used to design a 3D pattern against a flat background (FIG. 13a). This pattern is then transferred for use to the PTL modeling system of the current invention to evolve the dynamics of the liquid film into its final shape according to the mechanism described (FIG. 13b). The software program reduces the imported image to a finely meshed object, allowing the film shape to evolve through the use of finite element simulations. As shown, the thermocapillary stresses generated at the film interface shape the film into the mirror image of the imposed substrate pattern. FIG. 13c provides a top view of the evolved pattern prior to solidification. Finally, FIG. 13d provides an image of the pattern evolved looking from below and prior to solidification.

CONCLUSIONS

The current invention demonstrates that it is possible to model by numerical simulation thermal gradients affecting pattern fidelity and waveform interference resulting from thermocapillary shaping of nanoscale liquefiable films. Using the method, selective and engineered growth of individual features is made possible in one process step despite the proximity of adjacent structure formation. In addition, using the method and apparatus engineered thermal gradient fields can be produced such that thermocapillary waves induced within the molten polymer film can be made to interfere constructively or destructively depending on the distance between emerging structures. This dynamic method of film patterning can provide a fabricator with the temporal control parameters necessary to minimize feature distortion by thermocapillary waves.

In summary, the current invention provides an apparatus and method for "Patterned Thermocapillary Lithography" or PTL that allows for the controlled growth of three-dimensional structures formed by thermocapillary instability. The predictions made using the novel method are shown to provide critical pillar spacing as a function of gap spacing for various geometric parameters and material coefficients. The method also provides numerical methods, which elucidate how these 3D features form and grow in time. It also provides an estimate of the time required to form different in-plane patterns, as well as the time required to form pillars of a specified height. Using the method, it is also possible to model experimental artifacts, such as, for example, the possibility that the upper and lower substrates are not completely parallel, which affects the spacing of the nanopillars and their temporal evolution.

There are several technological advantages inherent in this fabrication process, which can shape and solidify 3D microscale or nanoscale objects in situ. These include the ability to fabricate large area arrays with disparate feature sizes in one step, to pattern objects on rigid or flexible flat or curved substrates, and to create components with specularly smooth surfaces since the ultimate shapes obtained emerge from a smooth liquid melt. This last aspect is particularly problematic in conventional photolithographic patterning where wet and dry etching to shape and remove material induces significant surface roughness. This roughness degrades the quality of optical or other electromagnetic signal propagation. In addition, the liquid melt can be made to contain other particulate matter so that material properties like the reflectivity, refractive index, local density, color, opacity, birefringence, chromatic dispersion, polarization, phase retardation, optical nonlinearities, and other features can be embedded in place by shaping the local flow through thermocapillary stresses. For example, the flow can be used to help align anisotropic embedded particulate matter within pillars to induce birefringence or to modulate in situ the local refractive index of the structures to be formed.

Accordingly, the process according to the invention can be used in a multitude of possible applications in the general category of nanoscale structures such as multilayered structures and the patterning of active materials, such as, for example, chemically and/or magnetically and/or optically and/or electrically active, as well as 'inert' substrates, such as, for example, chemically resistant materials or electrically inert materials.

In particular, the present invention can be used to fabricate specularly smooth microscale and nanoscale components, including but not limited to small diffraction gratings, waveguides, ring resonators, Fabry Perot or other microcavity structures, ultrahydrophobic pillar arrays for drag reducing surfaces, microfluidic, biofluidic or optofluidic components, textured surfaces for optical, optoelectronic or biomedical applications, arrays containing well ordered holes or elongations for photonic devices, electronic devices for efficient energy harvesting and so on and could be advantageously employed in a great many technical fields, including, for example, microelectronics, microoptoelectronics, microelectromechanical systems (MEMS), and microoptoelectromechanical systems (MOEMS), biochips, polymer photonic devices (esp. photovoltaic cells, polymer photodiodes, bandgap materials, optoelectronics, electroluminescent materials), antireflection features/coatings ('gradated refractive index effects' and 'light maze' effects and the ability to make undercut structures), iridescent/interference structures having easy release properties ('highly blazed gratings'), polarization/polarization rotation structures (multilayered structures using different materials including diazo), antiwetting surfaces and surface energy/surface tension alterations (e.g., microwells or lotus leaves), surgically implanted devices or structures, enhanced catalytic activity surfaces, data storage, energy storage, and vertical transmission of signals (optical-fibre bundle effect), to name a few.

DOCTRINE OF EQUIVALENTS

Those skilled in the art will appreciate that the foregoing examples and descriptions of various preferred embodiments of the present invention are merely illustrative of the invention as a whole, and that variations of the present invention may be made within the spirit and scope of the invention. For example, it will be clear to one skilled in the art that alternative thermocapillary lithography techniques or alternative configurations of the method and/or apparatus would not affect the improved thermocapillary lithography patterning process of the current invention nor render the method unsuitable for its intended purpose. Accordingly, the present invention is not limited to the specific embodiments described herein but, rather, is defined by the scope of the appended claims.

What is claimed is:

1. A method of producing at least one patterned film to yield 2D or 3D structures comprising the steps of:
providing at least one liquefiable film;
providing a three-dimensional plan of a desired device;
designing a temperature field configured to generate thermocapillary forces in the film, said thermocapillary forces being designed to cause a mass transfer in the film such that a three-dimensional pattern is formed in the film corresponding to the three-dimensional plan, wherein the designing uses an interface evolution calculation that is configured to at least model the thermocapillary forces corresponding with the spatial variation in surface tension across the surface of the film, said thermocapillary forces comprising at least the tangential shear stresses created by the temperature field which promote the growth of the three-dimensional pattern, and the capillary forces inherent to the film which repress formation of the three-dimensional pattern; and
exposing said at least one film to the temperature field to produce the three-dimensional pattern in the film.

2. The method according to claim 1, wherein the patterning conditions are such that the initial thickness of the at least one film is smaller than the lateral feature sizes within the three-dimensional plan.

3. The method according to claim 1, further comprising:
providing a substrate having a supporting surface for supporting the at least one liquefiable film;
disposing the liquefiable film onto the supporting surface;
providing at least one opposing surface disposed opposite to the supporting surface; and
exposing the at least one liquefiable film to the temperature field by mapping the temperature field onto at least one of the supporting surface and the at least one opposing surface.

4. The method according to claim 3, wherein the temperature field is mapped onto at least one of the supporting surface and the at least one opposing surface by bringing the respective surface into thermal contact with a temperature control means.

5. The method according to claim 3, wherein the spacing between the supporting surface and the at least one opposing surface is within the range of 10 nm to 100,000 nm.

6. The method according to claim 3, wherein the temperature field is exposed by one of the techniques selected from the group consisting of spatially controlling the topography of at least one of the surfaces; spatially controlling the surface energy of at least one of the surfaces, and spatially controlling the temperature of at least one of the surfaces.

7. The method according to claim 3, wherein at least one of the supporting surface and the opposing surface are moved relatively to each other for at least a fraction of time the film is exposed to the temperature field.

8. The method according to claim 1, further comprising the step of liquefying the film one of either before or during exposure to the temperature field.

9. The method according to claim 1, further comprising the step of solidifying the film if necessary after producing the three-dimensional pattern.

10. The method according to claim 1, wherein the film thickness is within the range of 10 nm to 100,000 nm.

11. The method according to claim 1, wherein the film contains one of: an organic polymer, an organic oligomer, a glassy polymer, a liquid crystalline polymer, glass-forming material, silicon and silicon blends, inclusions, and mixtures thereof.

12. The method according to claim 1, wherein the film to be patterned is formed of at least two layers.

13. The method according to claim 1, wherein at least one additional effect selected from electrical, magnetic, electromagnetic, mechanical and evaporational is employed to support the patterning process.

14. The method according to claim 1, wherein the temperature field applies temperature gradients within the range of 0.1 to $10^{10}$ °C./m.

15. The method according to claim 1, wherein the spatial resolution of the thermal field is determine by the wavelength of the dominant growth mode of the film.

16. The method of claim 1 further comprising:
providing a substrate having a supporting surface for supporting the at least one liquefiable film;
disposing the liquefiable film onto the supporting surface;
providing at least one opposing surface disposed opposite to the supporting surface;
wherein the opposing surface is used to generate the temperature field that is used to produce the three-dimensional pattern in the film; and
wherein the variation in the topology of the opposing surface is accounted for in determining the temperature field to which the liquefiable film is exposed.

17. The method of claim 1 wherein spatially varying illumination fields are used to generate the temperature field that is used to produce the three-dimensional pattern in the film.

18. An apparatus for producing at least one patterned film, the apparatus comprising:
a substrate having a supporting surface for supporting the at least one film to be patterned;
a temperature field in thermal communication with the film such that the temperature field generates controlled thermocapillary forces which cause an engineered mass transfer in the film such that a pre-selected three-dimensional pattern is formed in the film, wherein the temperature field is configured in accordance with an interface evolution calculation designed to at least model the thermocapillary forces corresponding with the spatial variations in surface tension across the surface of the film, said thermocapillary forces comprising at least the tangential shear stresses created by the temperature field which promote the growth of the three-dimensional pattern, and the capillary forces inherent to the film which repress formation of the three-dimensional pattern; and
at least a first temperature controller adapted to generate at least one temperature field in the film.

19. The apparatus according to claim 18, further comprising at least one opposing surface provided opposite to the supporting surface, wherein the spacing between the supporting surface and the at least one opposing surface is within the range of 10 nm to 100,000 nm.

20. The apparatus according to claim 19, further comprising at least a second temperature controller, said second temperature controller being in thermal communication with the at least one opposing surface, and wherein the temperature field is produced by differentially heating at least one of the supporting surface and at least one opposing surface.

21. The apparatus according to claim 19, wherein the temperature field comprises a pattern disposed on at least one of the supporting surface and the at least one opposing surface, said pattern being formed by one of the group consisting of topographic features, spatially varying surface energy, and a spatially varying thermal conductivity.

22. The apparatus according to claim 18, wherein the substrate is a semiconductor material.

23. The apparatus according to claim 18, further comprising means for applying an additional force selected form the group consisting of electrical, magnetic, electromagnetic, mechanical and evaporational to the film.

24. The apparatus according to claim 18, wherein the apparatus and film are constructed such that the initial thickness of the at least one film is smaller than the lateral feature sizes within the three-dimensional plan.

25. The apparatus according to claim 18, wherein the spatial resolution of the thermal field is determine by the wavelength of the dominant growth mode of the film.

26. The apparatus according to claim 18, wherein temperature field comprises a plurality of temperature differentials within the range of $0.1°$ C./m to $10^{10°}$ C./m.

* * * * *

UNITED STATES PATENT AND TRADEMARK OFFICE
CERTIFICATE OF CORRECTION

PATENT NO. : 8,793,006 B2  
APPLICATION NO. : 12/626239  
DATED : July 29, 2014  
INVENTOR(S) : Sandra M. Troian Page 1 of 1

It is certified that error appears in the above-identified patent and that said Letters Patent is hereby corrected as shown below:

In the Claims

Col. 30, Claim 25, line 23, change "is determine" to "is determined"

Signed and Sealed this
Twenty-first Day of April, 2015

Michelle K. Lee
*Director of the United States Patent and Trademark Office*